(12) United States Patent
Nishimura et al.

(10) Patent No.: US 8,633,481 B2
(45) Date of Patent: Jan. 21, 2014

(54) SEMICONDUCTOR DEVICE AND PROCESS FOR PRODUCTION THEREOF

(75) Inventors: Jun Nishimura, Osaka (JP); Yukinobu Nakata, Osaka (JP); Yoshihito Hara, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/819,352

(22) PCT Filed: Aug. 26, 2011

(86) PCT No.: PCT/JP2011/069266
§ 371 (c)(1),
(2), (4) Date: Feb. 27, 2013

(87) PCT Pub. No.: WO2012/029644
PCT Pub. Date: Mar. 8, 2012

(65) Prior Publication Data
US 2013/0153904 A1 Jun. 20, 2013

(30) Foreign Application Priority Data
Aug. 30, 2010 (JP) ................................. 2010-192500

(51) Int. Cl.
*H01L 29/10* (2006.01)
*H01L 29/12* (2006.01)
(52) U.S. Cl.
USPC ........ 257/43; 257/71; 257/288; 257/E29.255; 438/99; 438/149; 438/299
(58) Field of Classification Search
USPC ........ 257/43, 71, 288, E29.255; 438/99, 149, 438/299
See application file for complete search history.

(56) References Cited

U.S. PATENT DOCUMENTS 5,148,248 A * 9/1992 Possin et al. .................. 257/356
5,691,786 A 11/1997 Nakai
(Continued)

FOREIGN PATENT DOCUMENTS

| JP | 08-062634 A | 3/1996 |
| JP | 2003-086808 A | 3/2003 |

(Continued)

OTHER PUBLICATIONS

Official Communication issued in International Patent Application No. PCT/JP2011/069266, mailed on Oct. 11, 2011.

(Continued)

*Primary Examiner* — William D Coleman
*Assistant Examiner* — Nicholas Tobergte
(74) *Attorney, Agent, or Firm* — Keating & Bennett, LLP

(57) ABSTRACT

A semiconductor device (1000) includes a thin film transistor having a gate line (3*a*), source and drain lines (13*as*, 13*ad*), and an island-like oxide semiconductor layer (7), and a capacitor element (105) having a first electrode (3*b*) formed from the same conductive film as the gate line (3*s*), a second electrode (13*b*) formed from the same conductive film as the source line (13*as*), and a dielectric layer positioned between the first electrode and the second electrode. A gate insulating film (5) has a layered structure including a first insulating layer (5A) containing an oxide and a second insulating layer (5B) disposed on the side closer to the gate electrode closer than the first insulating film and having a higher dielectric constant than the first insulating film, the layered structure being in contact with the oxide semiconductor layer (7). The dielectric layer includes the second insulating film (5B) but does not include the first insulating film (5A). Accordingly, the deterioration of the oxide semiconductor layer due to oxygen deficiency can be suppressed without reducing the capacitance value of the capacitor element).

11 Claims, 15 Drawing Sheets

(56) References Cited

U.S. PATENT DOCUMENTS

| | | | |
|---|---|---|---|
| 6,821,827 B2 * | 11/2004 | Nakamura et al. | 438/166 |
| 7,384,860 B2 * | 6/2008 | Nakamura et al. | 438/486 |
| 8,426,851 B2 * | 4/2013 | Morosawa et al. | 257/43 |
| 2003/0047785 A1 | 3/2003 | Kawasaki et al. | |
| 2004/0046211 A1 * | 3/2004 | Shimotsusa et al. | 257/368 |
| 2005/0173734 A1 * | 8/2005 | Yoshioka et al. | 257/202 |
| 2007/0087487 A1 * | 4/2007 | Honda | 438/149 |
| 2007/0228452 A1 * | 10/2007 | Asami | 257/315 |
| 2007/0241327 A1 * | 10/2007 | Kim et al. | 257/43 |
| 2007/0262352 A1 | 11/2007 | Hirabayashi et al. | |
| 2008/0197350 A1 * | 8/2008 | Park et al. | 257/43 |
| 2009/0029530 A1 * | 1/2009 | Kunii | 438/478 |
| 2010/0035379 A1 | 2/2010 | Miyairi et al. | |
| 2010/0051934 A1 * | 3/2010 | Choung et al. | 257/43 |
| 2010/0193772 A1 | 8/2010 | Morosawa et al. | |
| 2012/0199891 A1 * | 8/2012 | Suzuki et al. | 257/288 |

FOREIGN PATENT DOCUMENTS

| | | |
|---|---|---|
| JP | 2007-293071 A | 11/2007 |
| JP | 2010-062549 A | 3/2010 |
| JP | 2010-152298 A | 7/2010 |
| JP | 2010-182819 A | 8/2010 |

OTHER PUBLICATIONS

Seo et al.; "76.2: Development of Highly Stable a-IGZO TFT with TiOx as a Passivation Layer for Active-Matrix Display"; Society for Information Display Digest, 2010; pp. 1132-1135.

Wu et al.; "P-20: An Efficient Method for Improving the Negative-Bias-Temperature-Stress (NBTS) Stability of Amorphous In-Ga-Zn-O TFT"; Society for Information Display Digest, 2010; pp. 1298-1300.

Mo et al.; "69.3: Amorphous Oxide TFT Backplane for Large Size AMOLED TVs"; Society for Information Display Digest, 2010; pp. 1037-1040.

English translation of Official Communication issued in corresponding International Application PCT/JP2011/069266, mailed on Mar. 21, 2013.

* cited by examiner

*FIG.2*
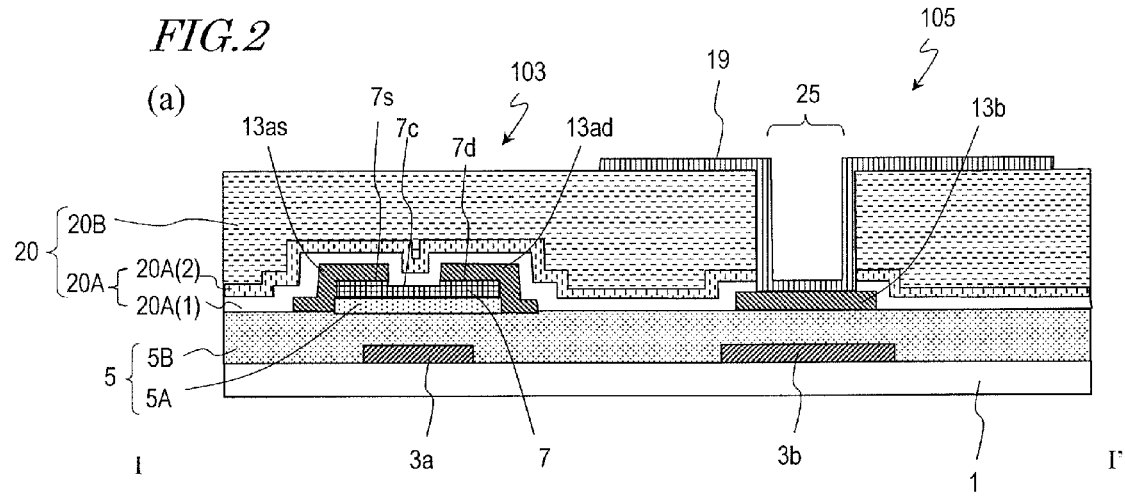
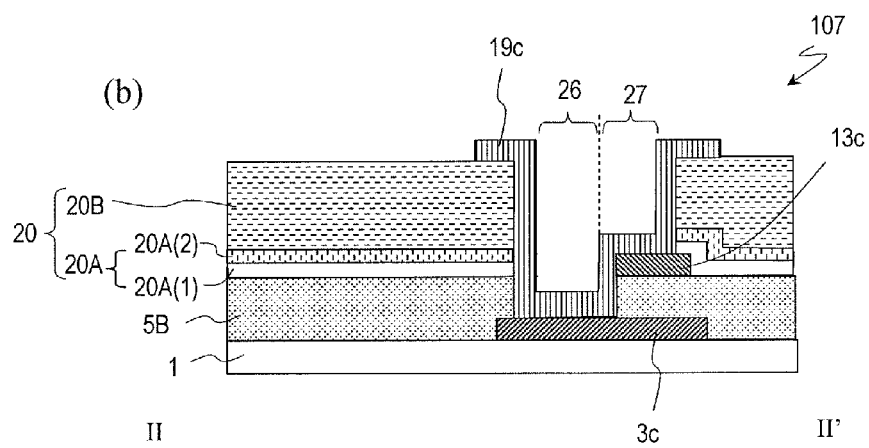

FIG.6
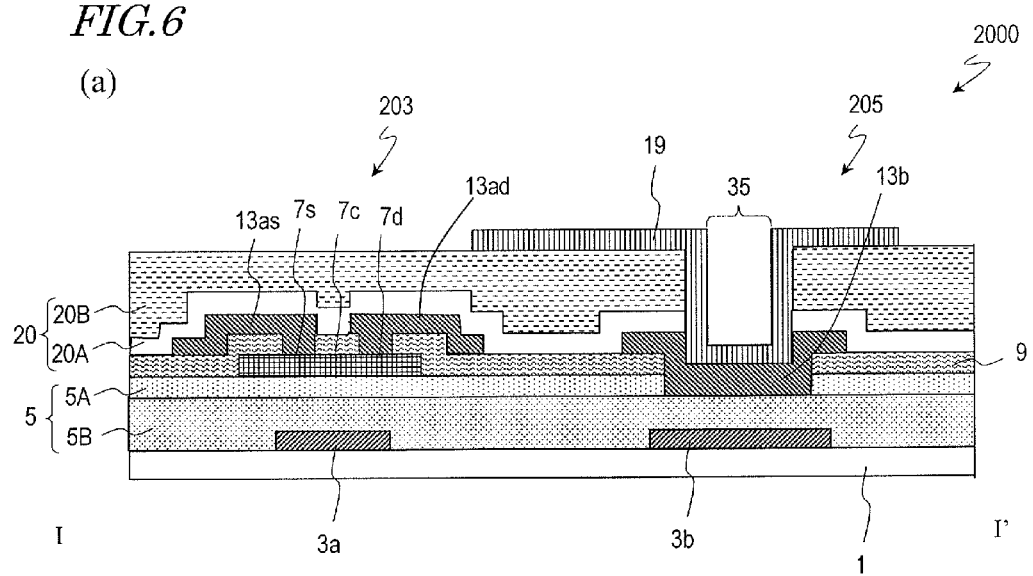
(a)
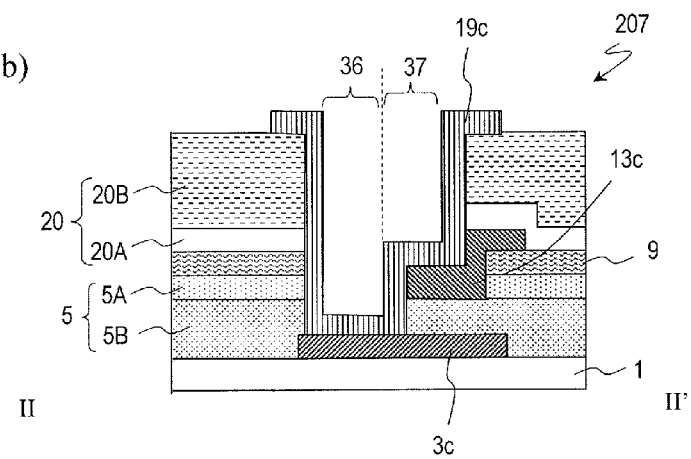
(b)

FIG.10
(a)
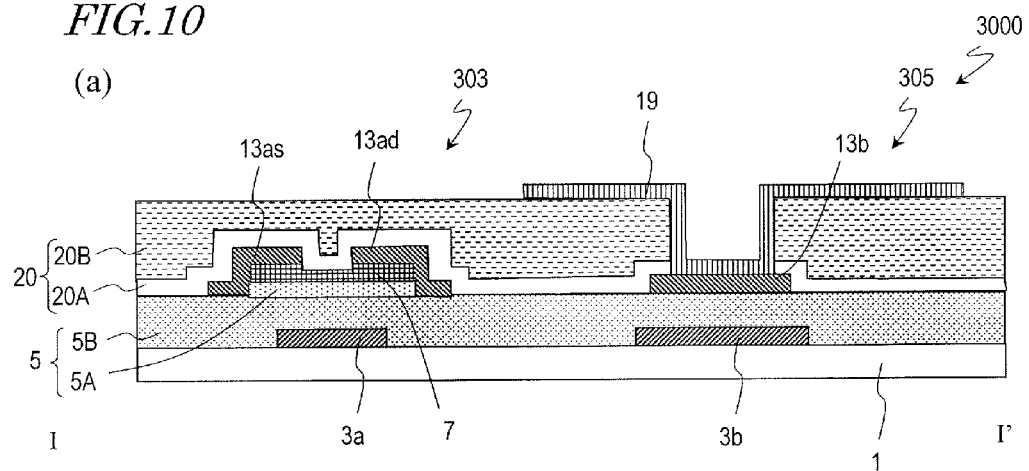
(b)
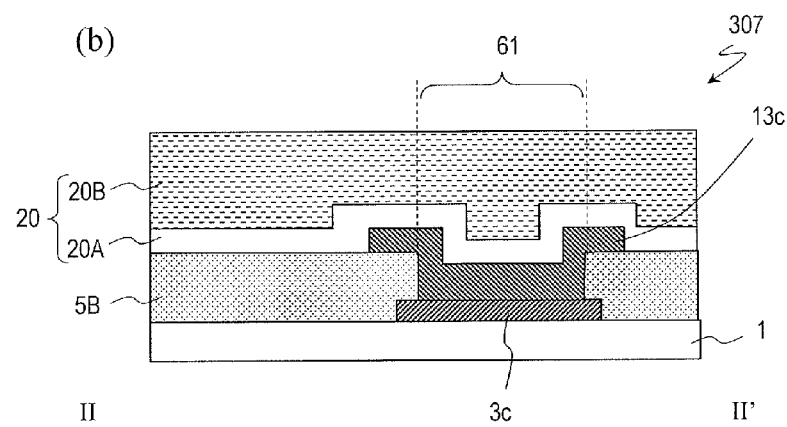

SEMICONDUCTOR DEVICE AND PROCESS FOR PRODUCTION THEREOF

TECHNICAL FIELD

The present invention relates to a semiconductor device provided with a thin film transistor and the production method thereof.

BACKGROUND ART

An active matrix substrate used in a liquid crystal display device or the like is provided with a switching element such as a thin film transistor (Thin Film Transistor: hereinafter referred to as "TFT") for each pixel. As such a switching element, conventionally, a TFT in which an amorphous silicon film is used as an active layer (hereinafter referred to as "an amorphous silicon TFT"), and a TFT in which a polycrystalline silicon film is used as an active layer (hereinafter referred to as "a polycrystalline silicon TFT") are widely utilized.

In recent years, as a material for the active layer of a TFT, it is proposed to use an oxide semiconductor instead of amorphous silicon or polycrystalline silicon (see Patent Documents No. 1 and No. 2, non-Patent Documents No. 1 to No. 3, and the like). Such a TFT is referred to as "an oxide semiconductor TFT". The oxide semiconductor has higher mobility than amorphous silicon. For this reason, the oxide semiconductor TFT can operate at higher speeds than the amorphous silicon TFT. In addition, an oxide semiconductor film is formed by a process which is simpler than that for a polycrystalline silicon film, so that the oxide semiconductor film can be applied to a device which is required to have a large area.

CITATION LIST

Patent Literature

Patent Document No. 1: Japanese Laid-Open Patent Publication No. 2010-62549
Patent Document No. 2: Japanese Laid-Open Patent Publication No. 2003-86808

Non-Patent Literature

Non-Patent Document No. 1: SID DIGEST 2010 P1132-1135
Non-Patent Document No. 2: SID DIGEST 2010 P1298-1300
Non-Patent Document No. 3: SID DIGEST 2010 P1037-1040

SUMMARY OF INVENTION

Technical Problem

As the result of the investigation by the inventors of the present invention, the production of an oxide semiconductor TFT having the same configuration as that of a conventional silicon TFT involves the following problems.

In a silicon TFT, generally, a silicon nitride (SiNx) film with high dielectric constant is used as a gate insulating film. The SiNx film is formed by plasma-enhanced chemical vapor deposition (PECVD), for example.

In the oxide semiconductor TFT, similarly to the silicon TFT, if a gate insulating film of an SiNx film is formed on the oxide semiconductor layer by PECVD (a bottom-gate structure), the oxide semiconductor layer is exposed to hydrogen plasma, so that reduction reaction of the oxide semiconductor easily occurs. As a result, electron carriers are generated in the oxide semiconductor layer due to oxygen deficiency, so that the resistance of the oxide semiconductor layer may disadvantageously be lowered.

The SiNx film is likely to contain hydrogen due to the fabrication process thereof. Accordingly, not only in the case where the oxide semiconductor TFT has the bottom-gate structure, but also in the case where the oxide semiconductor TFT has a top-gate structure, if the oxide semiconductor layer is disposed so as to be in contact with the SiNx film, the oxide semiconductor layer may possibly be deteriorated because of the oxygen deficiency (reduction of resistance).

In order to avoid the above-mentioned problem, it is considered that a silicon oxide ($SiO_2$) film may be used as the gate insulating film. The $SiO_2$ film is formed by CVD, for example, so that the oxide semiconductor layer will not be exposed to hydrogen plasma during the fabrication. In addition, since the $SiO_2$ film does not contain so much hydrogen as compared with the SiNx film, the above-mentioned problem does not occur. Moreover, by the oxygen contained in the $SiO_2$ film, part of the oxygen deficiency of the oxide semiconductor layer can be recovered. However, the dielectric constant E (about 4) of the $SiO_2$ film is lower than the dielectric constant (about 7 to 8) of the SiNx film. For this reason, in the case where the $SiO_2$ film is used, in order to ensure the gate capacitance ($=\in S/d$), it is necessary to reduce the thickness d of the gate insulating film as compared with the prior art, or to increase the element size (the area of gate electrode) S. The reduction of thickness d of the gate insulating film may cause an increase in gate leak current or electrical breakdown due to the tunnel current. Even if the variation in thickness of the gate insulating film (the difference of film thickness) is substantially the same as that of the prior art, the influence is relatively increased, so that it is difficult to ensure the uniformity of element performance in a substrate. On the other hand, the increase of the gate electrode area S may cause the reduction in the degree of integration of elements, or the reduction of aperture ratio of a liquid crystal display device.

On the contrary, in Patent Documents No. 1 and No. 2, a layered film of $SiO_2$ film and SiN film is used as the gate insulating film. Accordingly, the direct contact between the oxide semiconductor layer and the SiNx film can be prevented, so that it is possible to suppress the deterioration of oxide semiconductor layer. As compared with the case where only the $SiO_2$ film is used as the gate insulating film, the reduction of gate capacitance can be suppressed.

However, in the case where an active matrix substrate for a liquid crystal display device is fabricated, for example, if the above-mentioned layered film is used as the gate insulating film, the following problem may occur.

In general, in the active matrix substrate of the liquid crystal display device, a storage capacitor (a CS capacitor) is provided for each pixel in parallel with a liquid crystal capacitor. As a dielectric layer of the CS capacitor, an insulating layer formed from the same film as the gate insulating film is generally used. This is because the TFT and the CS capacitor are formed on one and the same substrate without increasing the number of production processes. In such an active matrix substrate, if a gate insulating film of a two-layer structure disclosed in Patent Documents No. 1 and No. 2 is used, the dielectric layer of the CS capacitor may have the same two-layer structure. Thus, a sufficient capacitance value may not be ensured in some cases.

The present invention has been conducted in order to solve the above-described problems, and the main object of the present invention is to provide a semiconductor device including an oxide semiconductor thin film transistor in which the deterioration of an oxide semiconductor layer due to oxygen deficiency can be suppressed without lowering the capacitance value of a capacitor element such as a CS capacitor.

Solution to Problem

The semiconductor device of the present invention is a semiconductor device including a substrate, and a thin film transistor and a capacitor element disposed on the substrate, wherein the thin film transistor includes: an island-like oxide semiconductor layer having a channel region, and a first contact region and a second contact region positioned on respective sides of the channel region; a gate line disposed so as to overlap at least the channel region of the oxide semiconductor layer; a gate insulating layer formed between the gate line and the oxide semiconductor layer; a source line electrically connected to the first contact region; and a drain line electrically connected to the second contact region, the capacitor element includes: a first electrode formed from the same conductive film as the gate line; a second electrode formed from the same conductive film as the source line; and a dielectric layer positioned between the first and second electrodes, the gate insulating layer has a layered structure including a first insulating film containing an oxide which is in contact with the oxide semiconductor layer, and a second insulating film disposed on the side closer to the gate electrode than the first insulating film, the second insulating film having a dielectric constant higher than the first insulating film, and the dielectric layer includes the second insulating film, but does not include the first insulating film.

In one preferred embodiment, the first insulating film is positioned below the oxide semiconductor layer, and the first insulating film has substantially the same island-like pattern as that of the oxide semiconductor layer when viewed from the above of the substrate.

In one preferred embodiment, the gate line is disposed on the side of the substrate of the oxide semiconductor layer, and the semiconductor device further comprises an etch stop which covers at least the channel region of the oxide semiconductor layer.

In one preferred embodiment, an opening portion which reaches the second insulating film is formed in the etch stop and the first insulating film, and the second electrode is in contact with the second insulating film in the opening portion.

In one preferred embodiment, the semiconductor device further includes a first interlayer insulating layer disposed on the thin film transistor and the capacitor element, and a second interlayer insulating layer disposed on the first interlayer insulating layer, and the first interlayer insulating layer has a layered structure including a lower film containing an oxide and an upper film disposed on the lower film.

The semiconductor device may further include a conductive layer disposed on the second interlayer insulating layer, and the conductive layer may be electrically connected to the first electrode or the second electrode of the capacitor element.

In one preferred embodiment, the thickness of the second insulating film is larger than the thickness of the first insulating film, and equal to or smaller than five times the thickness of the first insulating film.

The first insulating film may be a silicon oxide film, and the second insulating film may be a silicon nitride film.

The production method of the semiconductor device of the present invention is a production method of the above-described semiconductor device, including the steps of: (A) forming a gate line and a first electrode of a capacitor element on a substrate; (B) depositing a second insulating film, a first insulating film, and an oxide semiconductor film, in this order, on the substrate on which the gate line and the first electrode are formed; (C) patterning the oxide semiconductor film, thereby obtaining an island-like oxide semiconductor layer; (D) removing a portion of the first insulating film positioned on the first electrode, thereby exposing the surface of the second insulating film; and (E) forming a metal film on the oxide semiconductor layer and on the exposed surface of the second insulating film, and patterning the metal film, thereby obtaining a source line, a drain line, and a second electrode of the capacitor element.

In one preferred embodiment, in the step (D), the first insulating film is etched by using the oxide semiconductor layer as a mask.

In one preferred embodiment, the production method further includes, after the step (C), the steps of: (F1) forming an etch stop on the oxide semiconductor layer and the first insulating film; and (F2) patterning the etch stop, the step (D) is performed simultaneously with the step (F2), and in the steps (D) and (F2), a portion of the etch stop positioned on a region which will be the first and second contact regions of the oxide semiconductor layer is removed, and a portion of the etch stop and the first insulating film positioned on the first electrode is removed, thereby exposing the second insulating film.

The first insulating film may be a silicon oxide film, and the second insulating film may be a silicon nitride film.

Advantageous Effects of Invention

According to the present invention, in the semiconductor device provided with an oxide semiconductor TFT, the deterioration of the oxide semiconductor layer due to the occurrence of oxygen deficiency in the oxide semiconductor layer (the reduction of resistance) can be suppressed while the lowering of the capacitance value of a capacitor element is suppressed.

In addition, the above-described semiconductor device can be produced without complicating the production process.

BRIEF DESCRIPTION OF DRAWINGS

In FIG. 2, (a) is a sectional view, taken along a line I-I' in FIG. 1, of an oxide semiconductor TFT 103 and a CS capacitor 105 of the semiconductor device 1000, and (b) is a sectional view, taken along a line II-II' in FIG. 1, of a source and gate connecting portion 107.

In FIG. 6, (a) is a sectional view of an oxide semiconductor TFT 203 and a CS capacitor 205 of a semiconductor device 2000 in a second embodiment of the present invention, and (b) is a sectional view of a source and gate connecting portion 207.

In FIG. 10, (a) is a sectional view of an oxide semiconductor TFT 303 and a CS capacitor 305 of a semiconductor device 3000 in a third embodiment of the present invention, and (b) is a sectional view of a source and gate connecting portion 307.

DESCRIPTION OF EMBODIMENTS

First Embodiment

Hereinafter, with reference to the accompanying drawings, a first embodiment of a semiconductor device according to the present invention will be described. The semiconductor device in this embodiment includes a thin film transistor having an active layer of oxide semiconductor (an oxide semiconductor TFT), and a capacitor element (herein a CS capacitor) formed on a substrate on which the oxide semiconductor TFT is formed. As for the semiconductor device in this embodiment, it is sufficient to include at least one oxide semiconductor TFT and at least one capacitor element. The semiconductor device in this embodiment widely includes an active matrix substrate, various display devices, electronic equipment, and the like.

Herein a TFT substrate provided with an oxide semiconductor TFT as a switching element will be described as an example. The TFT substrate in this embodiment can be suitably used in a liquid crystal display device.

Figure 1:
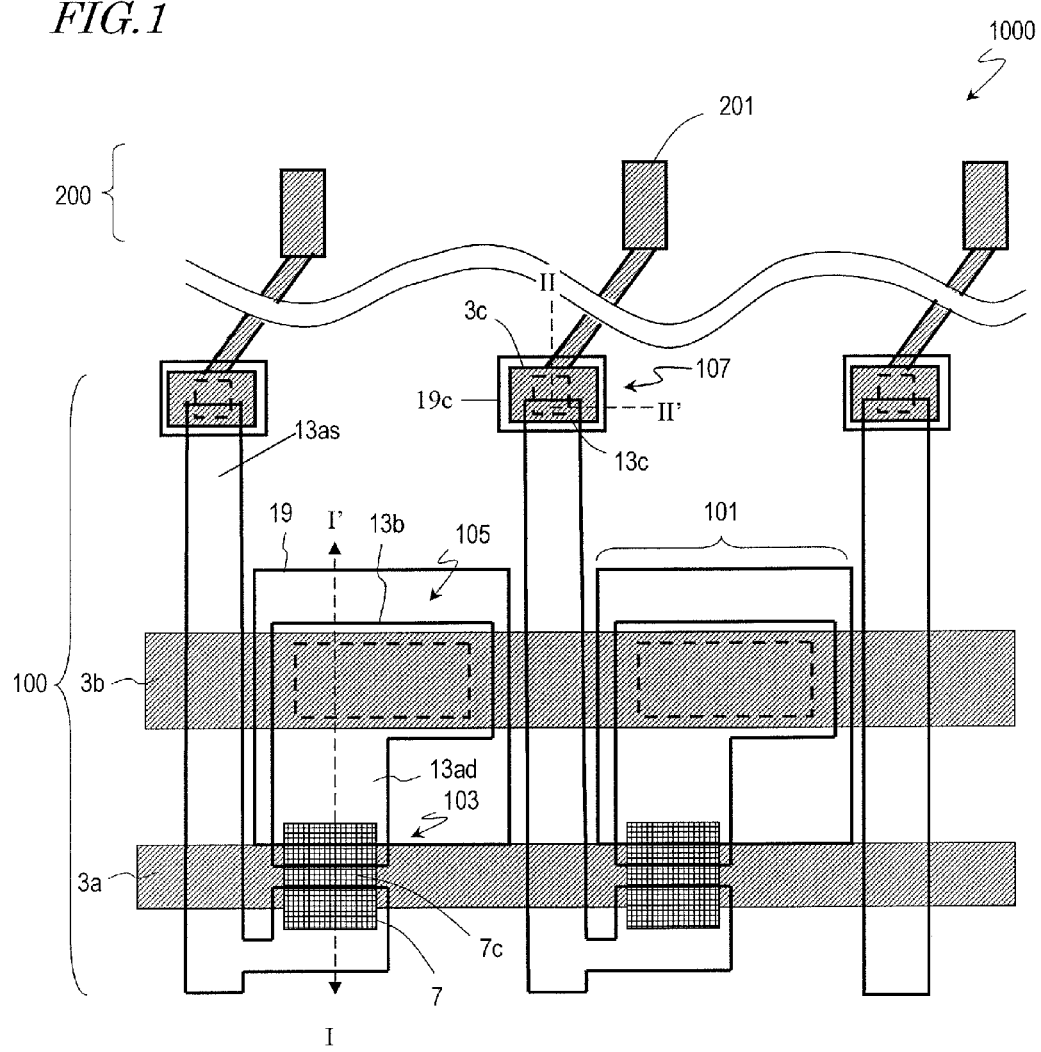
FIG. 1 is a plan view of a semiconductor device 1000 in a first embodiment of the present invention.

FIG. 1 is a plan view of a semiconductor device 1000 in this embodiment.

The semiconductor device (a TFT substrate) 1000 in this embodiment has a display area 100 including a plurality of pixel portions 101 and a terminal arranging area 200 formed in an area excluding the display area.

In each pixel portion 101, a source line 13as extending along a column direction of pixels, a gate line 3a and a CS capacitor line 3b extending along a row direction of pixels, an oxide semiconductor TFT 103, and a CS capacitor 105 are disposed. The gate line 3a and the CS capacitor line 3b are formed from the same conductive film. The oxide semiconductor TFT 103 is disposed in the vicinity of a crossing point of the source line 13as and the gate line 3a. The CS capacitor 105 is formed on the CS capacitor line 3b.

In the terminal arranging area 200, a plurality of terminal portions 201 for connecting the gate line 3a and the source line 13as to external lines are disposed. The source line 13as extends up to an end portion of the display area 100 (referred to as "a source connecting line 13c"), and the source line 13a is electrically connected to a line (referred to as "a gate connecting line") 3c formed from the same film as the gate line 3a in the source and gate connecting portion 107. In this embodiment, the source connecting line 13c and the gate connecting line 3c are connected via a conductive layer 19c formed from the same film as a pixel electrode 19. The gate connecting line 3c further extends to the terminal arranging area 200, and the gate connecting line 3c is connected to an external line in the terminal portion (a source terminal) 201. On the other hand, although not shown in the figure, the gate line 3a extends to the terminal arranging area 200, and the gate line 3a is connected to an external line in the terminal portion (a gate terminal).

An oxide semiconductor layer 7 of the oxide semiconductor TFT 103 is connected to the source line 13as and a drain line 13ad, respectively. The drain line 13ad extends onto the CS capacitor line 3b, and functions as an upper electrode 13b of the CS capacitor 105. The upper electrode 13b is connected to the pixel electrode 19 on the CS capacitor 105.

Next, sectional configurations of the oxide semiconductor TFT 103, the CS capacitor 105, and the source and gate connecting portion 107 will be described.

FIG. 2(a) is a sectional view of the oxide semiconductor TFT 103 and the CS capacitor 105 of the semiconductor device 1000. FIG. 2(a) shows a section taken along the line I-I' in FIG. 1. FIG. 2(b) is a sectional view of the source and gate connecting portion 107. FIG. 2(b) shows a section taken along the line II-II' in FIG. 1. The CS capacitor 105 and the source and gate connecting portion 107 are both formed on the same substrate 1.

As shown in FIG. 2(a), the oxide semiconductor TFT 103 includes the gate line 3a disposed on the substrate 1, a gate insulating layer 5 which covers the gate line 3a, and an island-like oxide semiconductor layer 7 formed on the gate insulating layer 5. The oxide semiconductor layer 7 is, for example, an In—Ga—Zn—O semiconductor (IGZO) layer. The gate insulating layer 5 has a layered structure including a silicon oxide film (an SiO$_2$ film) 5A which is in contact with the oxide semiconductor layer 7, and a silicon nitride film (an SiNx film) 5B disposed on the side of the gate line 3a of the SiO$_2$ film 5A. In this embodiment, the SiO$_2$ film 5A is formed by etching simultaneously with the oxide semiconductor layer 7, so as to have substantially the same pattern as the oxide semiconductor layer 7.

An upper surface of the oxide semiconductor layer 7 is electrically connected to the source line 13as and the drain line 13ad. In this specification, a region 7s which is in contact with the source line 13as of the oxide semiconductor layer 7 is referred to as "a first contact region", and a region 7d which is in contact with the drain line 13ad is referred to as "a second contact region". A region 7c of the oxide semiconductor layer 7 which overlaps the gate line 3a, and which is positioned between the first contact region 7s and the second contact region 7d is referred to as "a channel region".

The oxide semiconductor TFT 103 is covered with an interlayer insulating layer 20 formed on the source line 13as and the drain line 13ad. The structure and the material of the interlayer insulating layer 20 are not specifically limited. The interlayer insulating layer 20 in this embodiment includes a first interlayer insulating layer (a passivation film) 20A, and a second interlayer insulating layer 20B formed on the first interlayer insulating layer 20A. The first interlayer insulating layer 20A has a layered structure of, for example, a lower film 20A(1) of an $SiO_2$ film, and an upper film 20A(2) of an SiNx film. Alternatively, the first interlayer insulating layer 20A may be a single layer of SiNx film or $SiO_2$ film, for example. The second interlayer insulating film 20B may be a resin layer, for example. Preferably, an upper surface of the second interlayer insulating film 20B is substantially even.

The CS capacitor 105 includes a CS capacitor line 3b disposed on the substrate 1, an upper electrode 13b disposed so as to overlap the CS capacitor line 3b via the SiNx film 5B, and a dielectric layer positioned between the electrodes 3b and 13b. The dielectric layer is constituted by the SiNx film 5B of the gate insulating layer 5, and does not include the $SiO_2$ film 5A. The CS capacitor line 3b is formed from the same conductive film as the gate line 3a, and the upper electrode 13b is formed from the same conductive film as the source and drain lines 13as and 13ad. Herein the drain line 13ad extends onto the CS capacitor line 3b, and functions as the upper electrode 13b. The upper surface of the upper electrode 13b is in contact with the pixel electrode 19 in a contact hole 25 formed in the interlayer insulating layer 20.

As shown in FIG. 2(b), in the source and gate connecting portion 107, the gate connecting line 3c and the source connecting line 13c disposed on the gate connecting line 3c via the SiNx film 5B are electrically connected by means of a conductive layer 19c formed from the same conductive film as the pixel electrode 19. Specifically, the gate connecting line 3c is in contact with the conductive layer 19c in a contact hole 26 provided in the SiNx film 5B of the gate insulating layer 5 and the interlayer insulating layer 20. The source connecting line 13c is in contact with the conductive layer 19c in a contact hole 27 formed in the interlayer insulating layer 20. In this embodiment, the contact holes 26 and 27 are simultaneously formed by etching, and the contact holes continuously constitute a single opening portion. Alternatively, these contact holes 26 and 27 may form separate opening portions. However, if the contact holes 26 and 27 continuously constitute a single opening portion as shown in the figure, it is preferred that the area of the source and gate connecting portion 107 can be reduced.

According to the semiconductor device 1000 in this embodiment, the following advantages can be attained.

In this embodiment, the gate insulating layer 5 having the layered structure including the $SiO_2$ film 5A and the SiNx film 5B having higher dielectric constant than the $SiO_2$ film 5A is utilized. Only the $SiO_2$ film 5A which is one of the insulating films constituting the gate insulating layer 5 is in contact with the oxide semiconductor layer 7, and the SiNx film 5B is not in contact with the oxide semiconductor layer 7. Accordingly, when the SiNx film 5B is formed, it is possible to prevent the oxide semiconductor layer 7 from being damaged. In addition, since the SiNx film 5B is in contact with the oxide semiconductor layer 7, it is possible to suppress the occurrence of oxygen deficiency in the oxide semiconductor layer 7. In addition, the $SiO_2$ film 5A can be formed without causing damage to the oxide semiconductor layer 7, and the oxygen deficiency of the oxide semiconductor layer 7 can be recovered by the oxygen contained in the $SiO_2$ film 5A, so that the oxygen deficiency can be effectively reduced.

The gate insulating layer 5 in this embodiment includes the SiNx film 5B having higher dielectric constant than that of the $SiO_2$ film 5A. For this reason, the gate insulating layer 5 can have sufficient dielectric constant as a whole, so that sufficient gate capacitance can be ensured. Accordingly, it is unnecessary to make the gate insulating layer 5 thinner or to increase the element size for the purpose of ensuring the gate capacitance. Thus, it is possible to suppress the increase of gate leakage current, the dielectric breakdown, the reduction in degree of integration, or the like.

Moreover, in a conventional semiconductor device, a gate insulating layer is generally used as a dielectric layer of the CS capacitor. In this embodiment, only the SiNx film 5B having the higher dielectric constant of the gate insulating layer 5 is used as the dielectric layer of the CS capacitor 105. Accordingly, as compared with the case where the whole of the gate insulating layer 5 is used as the dielectric layer, the thickness of the dielectric layer can be reduced by the thickness of the $SiO_2$ film 5A. Thus, the capacitance value of the CS capacitor can be increased.

In this specification, one of the layers of the gate insulating layer 5 which is in contact with the oxide semiconductor layer 7 (the $SiO_2$ film 5A in this embodiment) may sometimes be referred to as "a first insulating film". The first insulating film is preferably an $SiO_2$ film. However, even if the first insulating film is another oxide film (e.g. $Al_2O_3$, $HfO_2$, $ZrO_2$, $La_2O_3$, $CeO_2$), the same effects as those described above can be attained. In addition, one of the layers of the gate insulating layer 5 which is positioned closer to the gate side than the first insulating film (the SiNx film 5B in this embodiment) may sometimes be referred to as "a second insulating film". The second insulating film is preferably an insulating film having higher dielectric constant than the first insulating film. Even if the second insulating film may be a film of HfSiOx or HfAlOx instead of the SiNx film, the same effects as those described above can be attained.

As described above, according to this embodiment, in the oxide semiconductor TFT 103, the reduction of dielectric constant as the whole of the gate insulating layer 5 can be suppressed, and the occurrence of oxygen deficiency in the oxide semiconductor layer 7 can b suppressed. In addition, a sufficient capacitance value can be ensured in the CS capacitor 105.

Moreover, if the gate insulating film is formed by the $SiO_2$ film only, there arises a problem that the production efficiency is largely reduced because of the etching rate of the $SiO_2$ film which is lower than the SiNx film. On the contrary, according to this embodiment, the $SiO_2$ film is used only for a layer of the gate insulating layer 5 which is positioned on the side of the oxide semiconductor layer 7, so that the reduction of production efficiency caused by the etching rate of the $SiO_2$ film can be minimized.

It is preferred that the $SiO_2$ film 5A may be thinner than the SiNx film 5B. Accordingly, the deterioration of the oxide semiconductor layer 7 is suppressed, and the sufficient gate capacitance can be more surely ensured. In addition, the reduction of production efficiency can be effectively suppressed.

The thickness of the $SiO_2$ film 5A is preferably 10 nm or more, for example. More preferably, the thickness of the $SiO_2$ film 5A is 20 nm or more, and for example, 50 nm. With such a thickness, the deoxidization of the oxide semiconductor layer 7 due to hydrogen plasma during the forming process of the SiNx film 5B or hydrogen contained in the SiNx film 5B after the formation can be effectively suppressed. On the other hand, if the $SiO_2$ film 5A is too thick, the gate capacitance of the gate insulating layer 5 is lowered, so that there is a disadvantageous possibility that the channel layer cannot be formed. In addition, the etching rate of the $SiO_2$ film 5A is low, so that the production efficiency may be largely reduced. For these reasons, the thickness of the SiO$_2$ film 5A is preferably 400 nm or less.

The thickness of the SiNx film 5B is preferably 100 nm or more, for example, in order to prevent the dielectric breakdown more surely. The thickness of the SiNx film 5B is 325 nm, for example. In order to suppress the reduction in electric capacitance of the gate insulating layer 5, it is preferred that the thickness of the SiNx film 5B may be 1000 nm or less.

It is preferred that the thickness of the SiNx film 5B may be larger than the thickness of the SiO$_2$ film 5A and may be equal to or less than five times the thickness of the SiO$_2$ film 5A. For example, the ratio of the thickness of the SiNx film 5B to the thickness of the SiO$_2$ film 5A is 2:1. Accordingly, the deterioration of the oxide semiconductor layer 7 due to the oxygen deficiency can be suppressed while the gate capacitance is ensured. Therefore, the reliability of the gate insulating layer 5 can be further increased.

The first interlayer insulating layer 20A in this embodiment includes an SiO$_2$ film as the lower film 20A(1) which is in contact with the upper surface of the oxide semiconductor layer 7 and an SiNx film as the upper film 20A(2). Accordingly, the upper surface of the oxide semiconductor layer 7 is not in contact with the SiNx film, so that the occurrence of oxygen deficiency in the oxide semiconductor layer 7 due to the SiNx film can be suppressed. In addition, the reduction in production efficiency because of the low etching rate of the SiO$_2$ film can be minimized as compared with the case where a single layer of SiO$_2$ film is used as the interlayer insulating layer 20.

The structure of the interlayer insulating layer 20 is not limited to the above-described structure. However, in order to more effectively suppress the deterioration of the oxide semiconductor layer 7, at least a portion of the interlayer insulating layer 20 which is positioned on the side of the oxide semiconductor layer 7 (a portion which is in contact with the oxide semiconductor layer 7) may preferably be an SiO$_2$ film. In the interlayer insulating layer 20, the reduction of dielectric constant due to the provision of the SiO$_2$ film is not seriously considered, so that the first interlayer insulating layer 20A may be a single layer of SiO$_2$ film.

The semiconductor device 1000 in this embodiment may be provided with another capacitor element such as a capacitor for capacitance coupling of pixel electrodes, for example, instead of the CS capacitor 105. Even in this case, the capacitor element includes an electrode formed from the same conductive film as the gate line 3a, an electrode formed from the same conductive film as the source line 13as, and a dielectric layer disposed between these electrodes. The dielectric layer does not include the first insulating film (herein the SiO$_2$ film 5A) of the gate insulating layer 5, and the dielectric layer may be constituted by the second insulating film (herein the SiNx film 5B). With such a configuration, by utilizing the common process to the oxide semiconductor TFT 103, a capacitor element having a sufficient capacitance value can be formed.

It is sufficient that the semiconductor device 1000 in this embodiment may include at least the oxide semiconductor TFT 103 and the capacitor element such as the CS capacitor 105 on the same substrate 1. The configuration of the source and gate connecting portion 107 in this embodiment is not limited to those described above. Alternatively, the present embodiment may not include the source and gate connecting portion 107.

Next, an example of the production method of the semiconductor device 1000 in this embodiment will be described. FIG. 3(a) to FIG. 3(c), FIG. 4(a) to FIG. 4(c), and FIG. 5 are sectional views of process steps, respectively, for illustrating the method for forming the oxide semiconductor TFT 103, the CS capacitor 105, and the source and gate connecting portion 107 on the substrate 1.

First, as shown in FIG. 3(a), in a substrate 1 such as a glass substrate, a gate line 3a, a CS capacitor line 3b, and a gate connecting line 3c are formed in a region in which an oxide semiconductor TFT is to be formed (hereinafter referred to as "a TFT forming region" 51), in a region in which a CS capacitor is to be formed (hereinafter referred to as "a CS capacitor forming region" 52), and in a region in which a source and gate connecting portion is to be formed (hereinafter referred to as "a connecting portion forming region" 53), respectively.

The gate line 3a, the CS capacitor line 3b, and the gate connecting line 3c are formed in such a manner that after a conductive film is formed on the substrate 1 by sputtering or the like, the conductive film is patterned by photolithography. As the conductive film, for example, a Ti/Al/TiN film (thickness: 100 nm or more and 500 nm or less, for example) may be used.

Next, as shown in FIG. 3(b), so as to cover the gate line 3a, the CS capacitor line 3b, and the gate connecting line 3c, an SiNx film 5B is formed as a first insulating film. Then, in the TFT forming region 51, on the SiNx film 5B, an SiO$_2$ film 5A is formed as a second insulating film. Thereafter, an island-like oxide semiconductor layer 7 is formed on the SiO$_2$ film 5A.

The SiNx film 5B is formed by plasma CVD, for example. The thickness of the SiNx film 5B is 325 nm, for example. The SiO$_2$ film 5A is formed by CVD, for example. The thickness of the SiO$_2$ film 5A is 50 nm, for example.

The oxide semiconductor layer 7 is formed in the following manner. First, by sputtering, an In—Ga—Zn—O semiconductor (IGZO) film having the thickness of 10 nm or more and 300 nm or less, for example, is formed on the SiO$_2$ film 5A. Thereafter, by photolithography, a resist mask (not shown) is formed so as to cover a predetermined region of the IGZO film. Then, a portion of the IGZO film which is not covered with the resist mask is removed by wet etching. Thereafter, the resist mask is peeled off. In this way, the island-like oxide semiconductor layer 7 is obtained.

Instead of the IGZO film, the oxide semiconductor layer 7 may be formed by using another oxide semiconductor film. For example, a Zn—O semiconductor (ZnO) film, an In—Zn—O semiconductor (IZO) film, a Zn—Ti—O semiconductor (ZTO) film, a Cd—Ge—O semiconductor film, a Cd—Pb—O semiconductor film, or the like may be used. As the oxide semiconductor film, it is preferred to use an amorphous oxide semiconductor film, because it can be produced at low temperatures, and high mobility can be realized.

Then, as shown in FIG. 3(c), by using the oxide semiconductor layer 7 as a mask, the patterning of the SiO$_2$ film 5A is performed by wet etching.

Next, as shown in FIG. 4(a), source and drain lines 13as and 13ad are formed in the TFT forming region 51, an upper electrode 13b is formed in the CS capacitor forming region 52, and a source connecting line 13c is formed in the connecting portion forming region 53. The source and drain lines 13as and 13ad are disposed so as to be in contact with the upper surface of the oxide semiconductor layer 7. The upper electrode 13b is disposed so as to overlap the CS capacitor line 3b via the SiNx film 5B. The source connecting line 13c is disposed so as to partially overlap the gate connecting line 3c via the SiNx film 5B.

The source and drain lines 13as and 13ad, the upper electrode 13b, and the source connecting line 13c are formed by depositing a metal film by sputtering, for example, and by patterning the metal film. The patterning of the metal film may be performed by known photolithography, for example. Specifically, a resist mask is formed on the metal film, and by using the resist mask, the metal film is etched (herein dry-etched). As shown in the figure, when the metal film is etched, part of the oxide semiconductor layer 7 may sometimes be etched. Thereafter, the resist mask is peeled off.

Then, as shown in FIG. 4(b), on the source and drain lines 13as and 13ad, the upper electrode 13d, and the source connecting line 13c, an interlayer insulating layer 20 is provided. Herein as a first interlayer insulating layer 20A, an $SiO_2$ film (thickness: 200 nm, for example) is formed by CVD. Next, on the first interlayer insulating layer 20A, a second interlayer insulating layer 20B (thickness: 3 μm, for example) is formed by using a positive type photosensitive resin film, for example.

Although not shown in the figure, an $SiO_2$ film (thickness: 50 nm, for example) and an SiNx film (thickness: 150 nm, for example) may be deposited in this order, for example, thereby forming a first interlayer insulating layer 20A (FIG. 2) having a layered structure.

Thereafter, the patterning of the second interlayer insulating layer 20B is performed. Specifically, the second interlayer insulating layer 20B is irradiated with light via a photo-mask, and an opening is formed in an exposed portion of the second interlayer insulating layer 20B, herein in a portion positioned on the upper electrode 13b and the gate connecting line 3c. Then, by using the patterned second interlayer insulating layer 20B as a mask, the first interlayer insulating layer 20A and the SiNx film 5B are etched. In this way, as shown in FIG. 4(c), in the CS capacitor forming region 52, a contact hole 25 is formed in the interlayer insulating layer 20. The contact hole 25 reaches the upper surface of the upper electrode 13b. In the connecting portion forming region 53, the first interlayer insulating film 20A and a portion of the SiNx film 5B which is not covered with the source connecting line 13c are etched. A portion of the SiNx film 5B which is positioned under the source connecting line 13c is not etched because the source connecting line 13c functions as a mask. In this way, as the result of one etching process, a contact hole 27 for exposing the source connecting line 13c and a contact hole 26 for exposing the gate connecting line 3c are formed.

Figure 5:
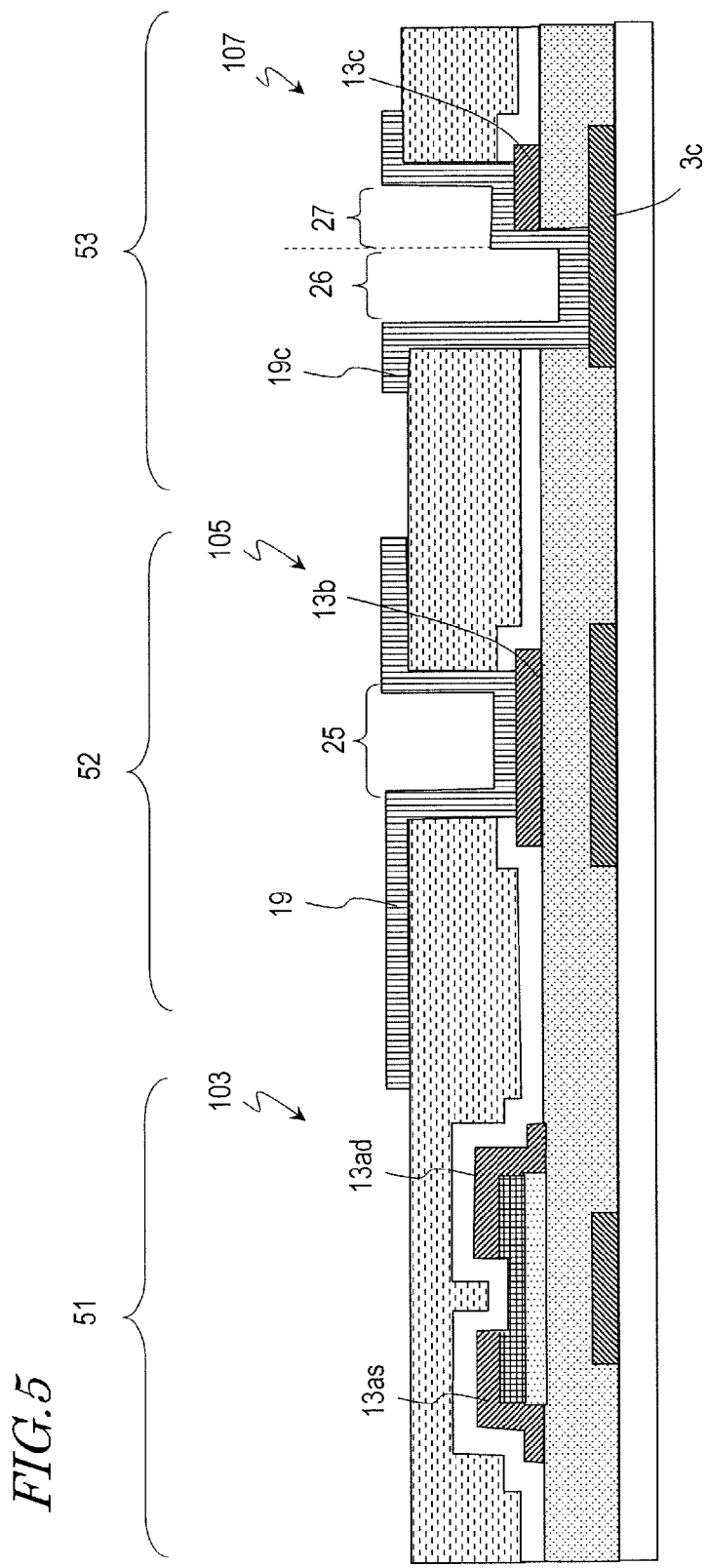
FIG. 5 is a sectional view of a process step for illustrating an example of a production method of the semiconductor device in the first embodiment.
Figure 7:
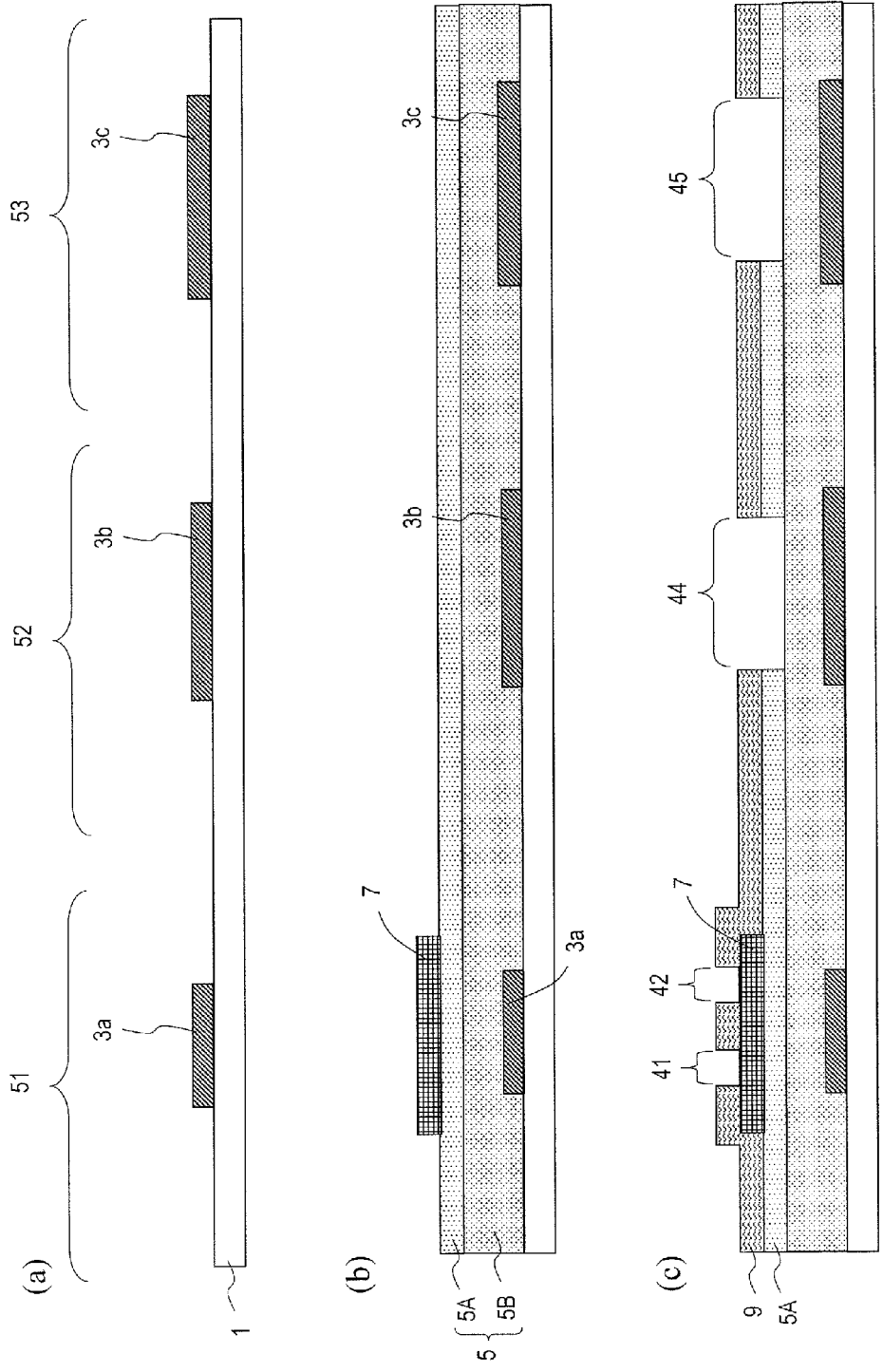
In FIG. 7, (a) to (c) are sectional views of process steps, respectively, for illustrating an example of a production method of the semiconductor device in the second embodiment.
Figure 8:
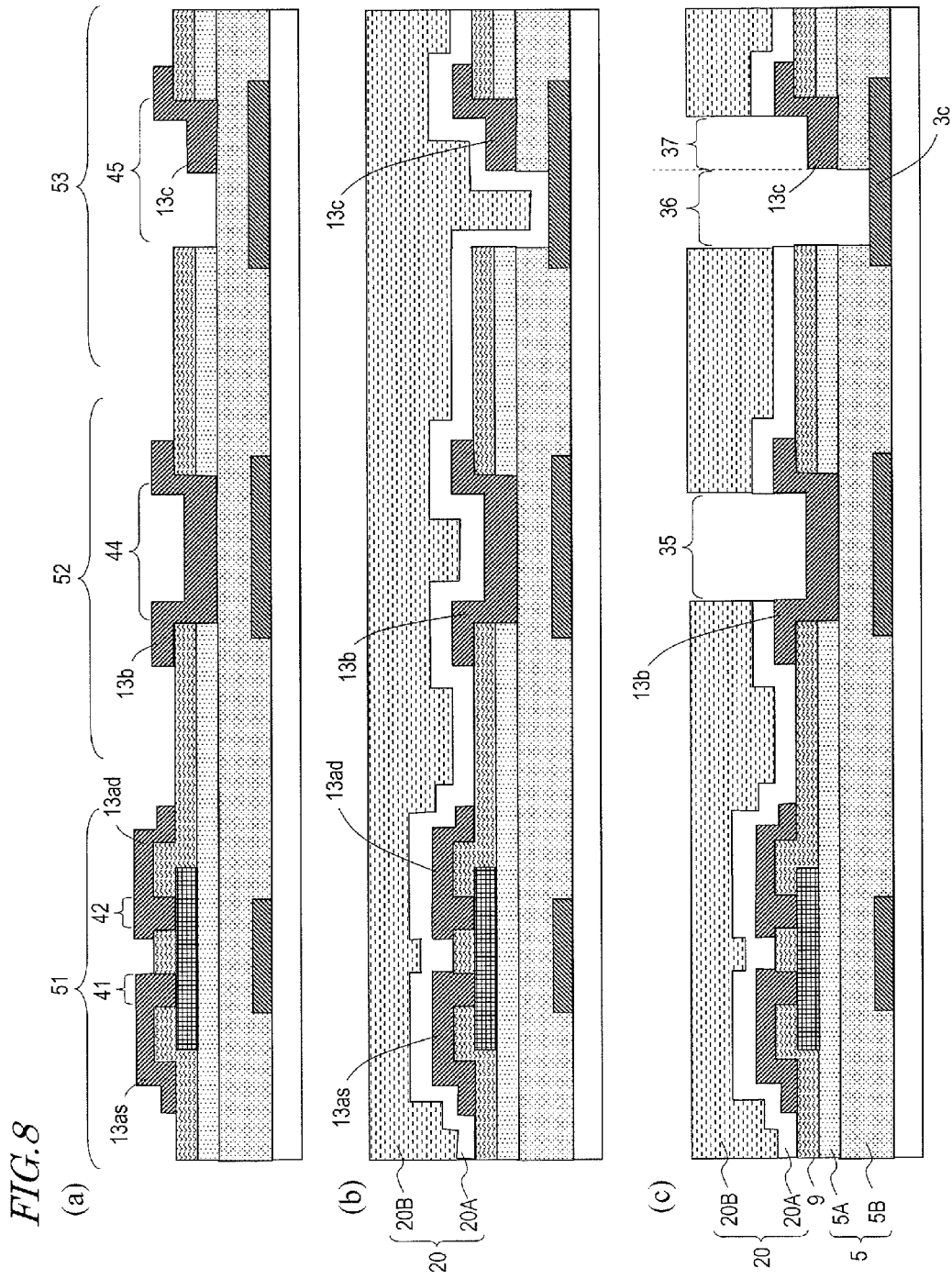
In FIG. 8, (a) to (c) are sectional views of process steps, respectively, for illustrating an example of a production method of the semiconductor device in the second embodiment.

Then, as shown in FIG. 5, a pixel electrode 19 and a conductive layer 19c are formed. Herein on the interlayer insulating layer 20 and in the contact holes 25, 26, and 27, a conductive film is deposited by sputtering, for example. As the conductive film, a transparent conductive film such as an ITO (Indium Tin Oxide) film (thickness: 50 to 200 nm) may be used, for example. Then, the conductive film is patterned by photolithography, thereby obtaining the pixel electrode 19 and the conductive layer 19c.

The pixel electrode 19 is disposed so as to be electrically connected to the drain line 13ad, and to be in contact with the upper electrode 13b in the contact hole 25. The conductive layer 19c is disposed so as to be in contact with the gate connecting line 3c in the contact hole 26, and to be in contact with the source connecting line 13c in the contact hole 27.

In this way, the oxide semiconductor TFT 103 is formed in the TFT forming region 51, the CS capacitor 105 is formed in the CS capacitor forming region 52, and the source and gate connecting portion 107 is formed in the connecting portion forming region 53.

Second Embodiment

Hereinafter a second embodiment of the semiconductor device according to the present invention will be described. In this embodiment, an etch stop 9 for protecting the channel region is provided on an oxide semiconductor layer 7.

FIG. 6(a) is a sectional view of an oxide semiconductor TFT 203 and a CS capacitor 205 in the semiconductor device 2000 in this embodiment. FIG. 6(b) is a sectional view of a source and gate connecting portion 207. For simplicity, the same components as those in FIG. 1 and FIG. 2 are designated by the same reference numerals, and the descriptions thereof are omitted. The plan view of the semiconductor device 2000 is the same as that shown in FIG. 1, so that the plan view is omitted.

In the oxide semiconductor TFT 203 in this embodiment, as shown in FIG. 6(a), the etch stop 9 is formed so as to be in contact with a portion of the upper surface of the oxide semiconductor layer 7 which will be a channel region 7c. Source and drain lines 13as and 13ad are in contact with a first contact region 7s and a second contact region 7d of the oxide semiconductor layer 7 in openings formed in the etch stop 9, respectively.

It is sufficient that the etch stop 9 may be formed so as to be in contact with at least the channel region 7c of the upper surface of the oxide semiconductor layer 7. However, in order to effectively suppress the deterioration of the oxide semiconductor layer 7 due to oxygen deficiency, as shown in the figure, it is preferred that the upper surface (excluding the first and second contact regions 7s and 7d) and the entire side face of the oxide semiconductor layer 7 may be covered with the etch stop 9.

Similarly to the CS capacitor 105 shown in FIG. 2(a), the CS capacitor 205 has a CS capacitor line 3b and an upper electrode 13b disposed on the CS capacitor line 3b via an SiNx film 5B. However, in this embodiment, the upper electrode 13b is in contact with the SiNx film 5B in an opening formed in an $SiO_2$ film 5A and the etch stop 9.

As shown in FIG. 6(b), in the source and gate connecting portion 207, a gate connecting line 3c and a source connecting line 13c are electrically connected by a conductive layer 19c. Specifically, the source connecting line 13c is provided in a contact hole 37 formed in the $SiO_2$ film 5A and the etch stop 9, so as to be in contact with the conductive layer 19c in the contact hole 37 formed in an interlayer insulating layer 20. The gate connecting line 3c is in contact with the conductive layer 19c in a contact hole 36 formed in the SiNx film 5B, the $SiO_2$ film 5A, the etch stop 9, and the interlayer insulating layer 20.

Although not shown in FIG. 6(a) and FIG. 6(b), as described above with reference to FIG. 2, the first interlayer insulating layer 20A may have a layered structure including the $SiO_2$ film as a lower film and the SiNx film as an upper film. Alternatively, the first interlayer insulating layer 20A may be a single layer of an $SiO_2$ film or an SiNx film. As in the example shown in FIG. 6, in the case where the first interlayer insulating layer 20A is not directly in contact with the oxide semiconductor layer 7, the first interlayer insulating layer 20A does not necessarily contain an oxide film such as an $SiO_2$ film.

According to this embodiment, similarly to the above-described embodiment, in the oxide semiconductor TFT 203, the gate insulating layer 5 has the two-layer structure of the $SiO_2$ film 5A and the SiNx film 5B, and the oxide semiconductor layer 7 is not in contact with the SiNx film 5B, so that the deterioration of the oxide semiconductor layer 7 can be suppressed while the thickness and the dielectric constant of the gate insulating layer 5 are ensured as a whole. On the other hand, in the CS capacitor 205, only the SiNx film 5B of the gate insulating layer 5 is utilized as the dielectric layer, so that a sufficient capacitance value can be ensured.

At least the channel region 7c of the oxide semiconductor layer 7 is protected by the etch stop 9, so that the process damage for the oxide semiconductor layer 7 can be suppressed especially in the etching process of the source and drain lines. Accordingly, the deterioration (the reduction in resistance) of the oxide semiconductor layer 7 can be more effectively suppressed.

It is sufficient that the etch stop 9 be an insulating film. Preferably, an oxide film such as an $SiO_2$ film may be used. If such an oxide film is used, in the case where oxygen deficiency occurs in the oxide semiconductor layer 7, the oxygen deficiency can be recovered by using the oxygen contained in the oxide film. Thus, the oxygen deficiency of the oxide semiconductor layer 7 can be effectively reduced.

In addition, as described below, when the etch stop is etched, the etching of the $SiO_2$ film 5A can be simultaneously performed. Accordingly, without increasing the number of masks used in the production process, the gate insulating layer of the oxide semiconductor TFT 203 can have the two-layer structure, and the dielectric layer of the CS capacitor 205 can have the single-layer structure.

Figure 3:
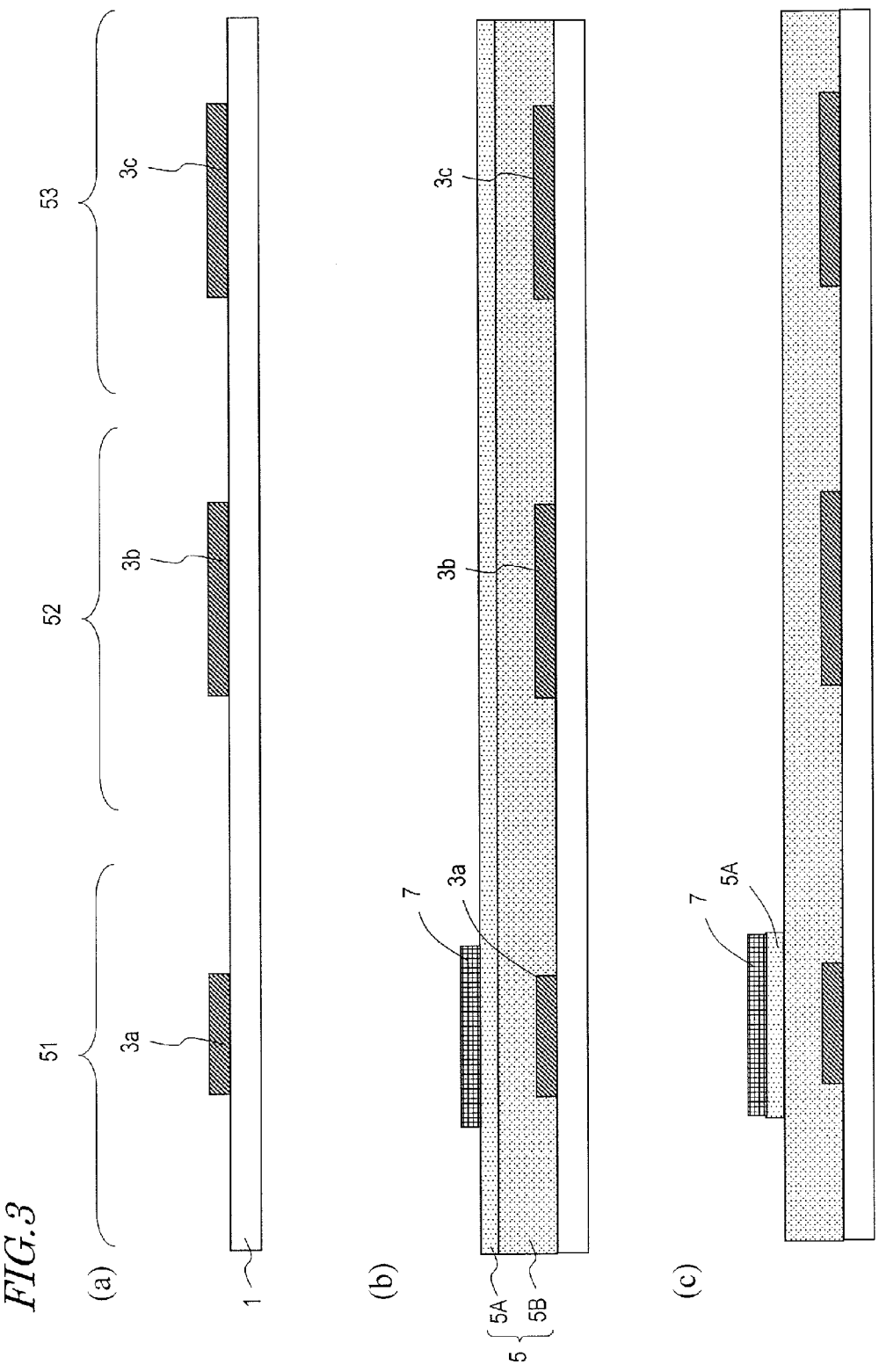
In FIG. 3, (a) to (c) are sectional views of process steps, respectively, for illustrating an example of a production method of the semiconductor device in the first embodiment.
Figure 4:
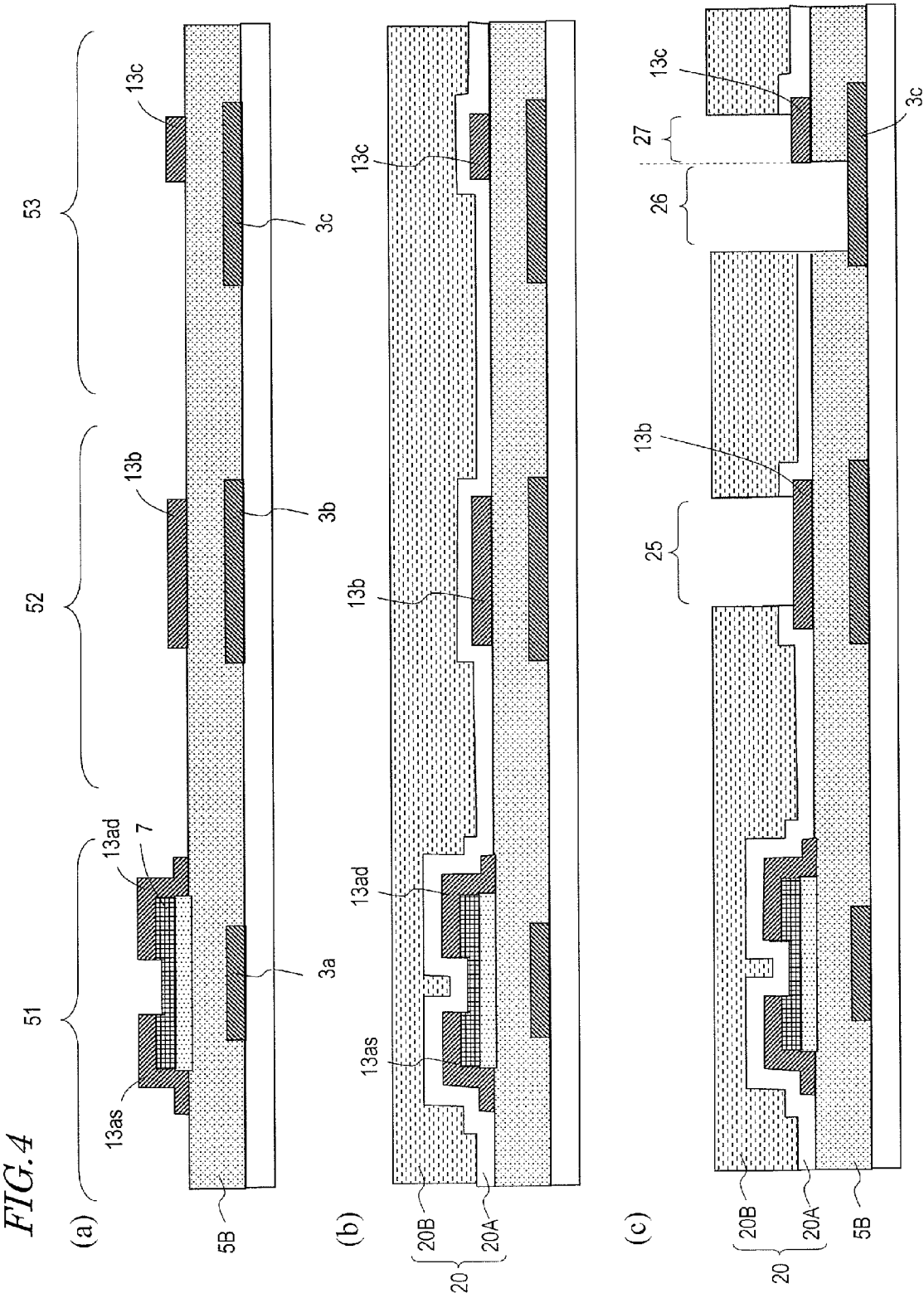
In FIG. 4, (a) to (c) are sectional views of process steps, respectively, for illustrating an example of a production method of the semiconductor device in the first embodiment.

Next, an example of the production method of the semiconductor device 2000 in this embodiment will be described. First, FIG. 7(a) to FIG. 7(c), FIG. 8(a) to FIG. 8(c), and FIG. 9 are sectional views of process steps for illustrating the method for forming the oxide semiconductor TFT 203, the CS capacitor 205, and the source and gate connecting portion 207 on the substrate 1, respectively. For simplicity, the same components as those shown in FIG. 3 to FIG. 5 are designated by the same reference numerals, and the descriptions thereof are omitted.

First, as shown in FIG. 7(a), in the substrate 1 such as a glass substrate, a gate line 3a, a CS capacitor line 3b, and a gate connecting line 3c are formed in the TFT forming region 51, the CS capacitor forming region 52, and the connecting portion forming region 53, respectively. The method for forming the gate line 3a, the CS capacitor line 3b, and the gate connecting line 3c may be the same as that described above with reference to FIG. 3(a).

Then, as shown in FIG. 7(b), so as to cover the gate line 3a, the CS capacitor line 3b, and the gate connecting line 3c, an SiNx film 5B and an $SiO_2$ film 5A are formed in this order. Then, in the TFT forming region 51, an island-like oxide semiconductor layer 7 is formed on the $SiO_2$ film 5A. The method for forming the SiNx film 5B, the $SiO_2$ film 5A, and the oxide semiconductor layer 7 may be the same as that described above with reference to FIG. 3(b).

Then, as shown in FIG. 7(c), on the oxide semiconductor layer 7 and the $SiO_2$ film 5A, an etch stop 9 is deposited. Thereafter, the patterning of the etch stop 9 and the $SiO_2$ film 5A is performed. As the result of the patterning, in the TFT forming region 51, contact holes 41 and 42 for exposing regions of the oxide semiconductor layer 7 which will be contact regions (regions which are connected to the source line and the drain line) are formed in the etch stop 9. In the CS capacitor forming region 52 and the connecting portion forming region 53, opening portions 44 and 45 for exposing the SiNx film 5B are formed in the etch stop 9 and the $SiO_2$ film 5A. The etch stop 9 and the $SiO_2$ film 5A are etched simultaneously. Accordingly, when viewed from the above of the substrate 1, the end faces of the etch stop 9 and the $SiO_2$ film 5A substantially match in the opening portions 44 and 45. As the etch stop 9, an $SiO_2$ film (thickness: 100 nm) is used herein.

In this way, if the patterning of the $SiO_2$ film 5A is performed by utilizing the patterning process of the etch stop 9, a portion of the $SiO_2$ film 5A positioned in the CS capacitor forming region 52 can be preferably etched without increasing the number of production processes (the number of masks).

Then, on the etch stop 9, in the contact holes 41 and 42, and in the opening portions 44 and 45, a metal film (an Al/Ti film, for example) is deposited by sputtering, for example. Thereafter, the patterning of the metal film is performed, thereby forming the source and drain lines 13as and 13ad in the TFT forming region 51, the upper electrode 13b in the CS capacitor forming region 52, and the source connecting line 13c in the connecting portion forming region 53, as shown in FIG. 8(a). The patterning of the metal film is performed by dry etching, for example.

The source and drain lines 13as and 13ad are disposed so as to be in contact with the upper surface of the oxide semiconductor layer 7 in the contact holes 41 and 42, respectively. The upper electrode 13b is disposed so as to overlap the CS capacitor line 3b via the SiNx film 5B in the opening portion 44. The source connecting line 13c is disposed so as to partially overlap the gate connecting line 3c via the SiNx film 5B in the opening portion 45.

Then, as shown in FIG. 8(b), an interlayer insulating layer 20 is provided on the source and drain lines 13as and 13ad, the upper electrode 13b, and the source connecting line 13c. Herein as the interlayer insulating layer 20, by the same method as that in the above-described embodiment, a first interlayer insulating layer 20A (e.g. an $SiO_2$ film) and a second interlayer insulating layer 20B (e.g. a positive-type photosensitive resin film) are formed in this order.

Thereafter, the second interlayer insulating layer 20B is irradiated with light via a photo mask. As a result, openings are formed in exposed portions of the second interlayer insulating layer 20B, herein in portions positioned on the upper electrode 13b and on the gate connecting line 3c. Then, by using the patterned second interlayer insulating layer 20B as a mask, the etching of the first interlayer insulating layer 20A and the SiNx film 5B is performed. In this way, as shown in FIG. 8(c), in the CS capacitor forming region 52, the first interlayer insulating layer 20A is etched, thereby forming a contact hole 35 for exposing the upper electrode 13b. In the connecting portion forming region 53, the first interlayer insulating layer 20A and a portion of the SiNx film 5B which is not covered with the source connecting line 13c are etched. The portion of the SiNx film 5B under the source connecting line 13c is not etched because the source connecting line 13c functions as a mask. In this way, by a single etching process, a contact hole 37 for exposing the source connecting line 13c and a contact hole 36 for exposing the gate connecting line 3c are formed.

Figure 9:
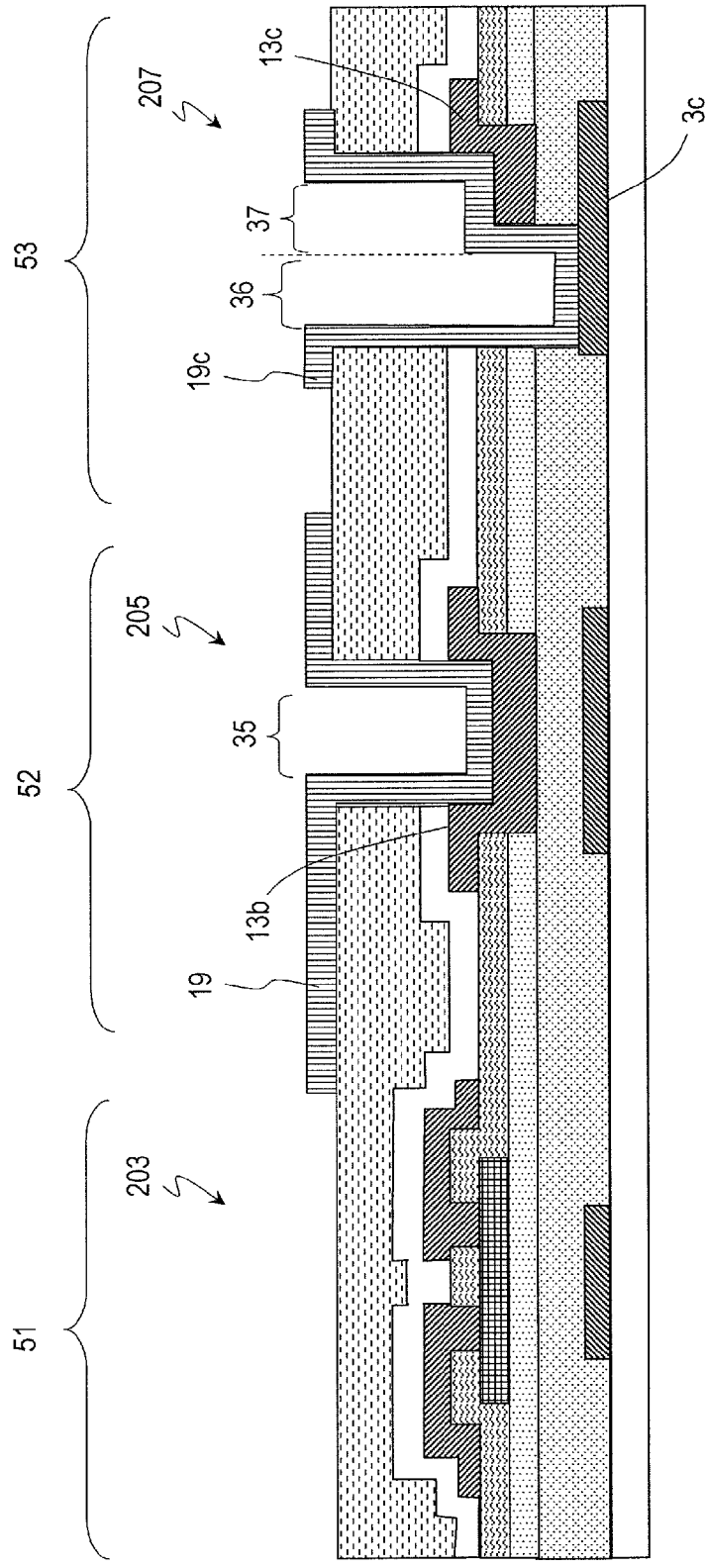
FIG. 9 is a sectional view of a process step for illustrating an example of a production method of the semiconductor device in the second embodiment.

Next, as shown in FIG. 9, a pixel electrode 19 and a conductive layer 19c are formed. Herein, a conductive film is deposited by sputtering, for example, on the interlayer insulating layer 20, and in the contact holes 35, 36, and 37. Then, the patterning of the conductive film is performed. As the conductive film, an ITO film (thickness: 50 to 200 nm) can be used, for example. In this embodiment, the pixel electrode 19 is electrically connected to the drain line 13ad, and is in contact with the upper electrode 13b in the contact hole 35. The conductive layer 19c is in contact with the gate connecting line 3c in the contact hole 36, and is in contact with the source connecting line 13c in the contact hole 37.

In this way, the oxide semiconductor TFT 203 is formed in the TFT forming region 51, the CS capacitor 205 is formed in the CS capacitor forming region 52, and the source and gate connecting portion 207 is formed in the connecting portion forming region 53.

According to the above-described method, in the patterning process of the etch stop 9, the patterning of the SiO$_2$ film 5A is simultaneously performed, and the predetermined region of the SiO$_2$ film 5A is removed. Accordingly, without increasing the number of production processes, the gate insulating layer 5 including the SiO$_2$ film 5A and the SiNx film 5B can be formed, and only the SiNx film 5B of the gate insulating layer 5 can be utilized as the dielectric layer of the CS capacitor 205.

Figure 17:
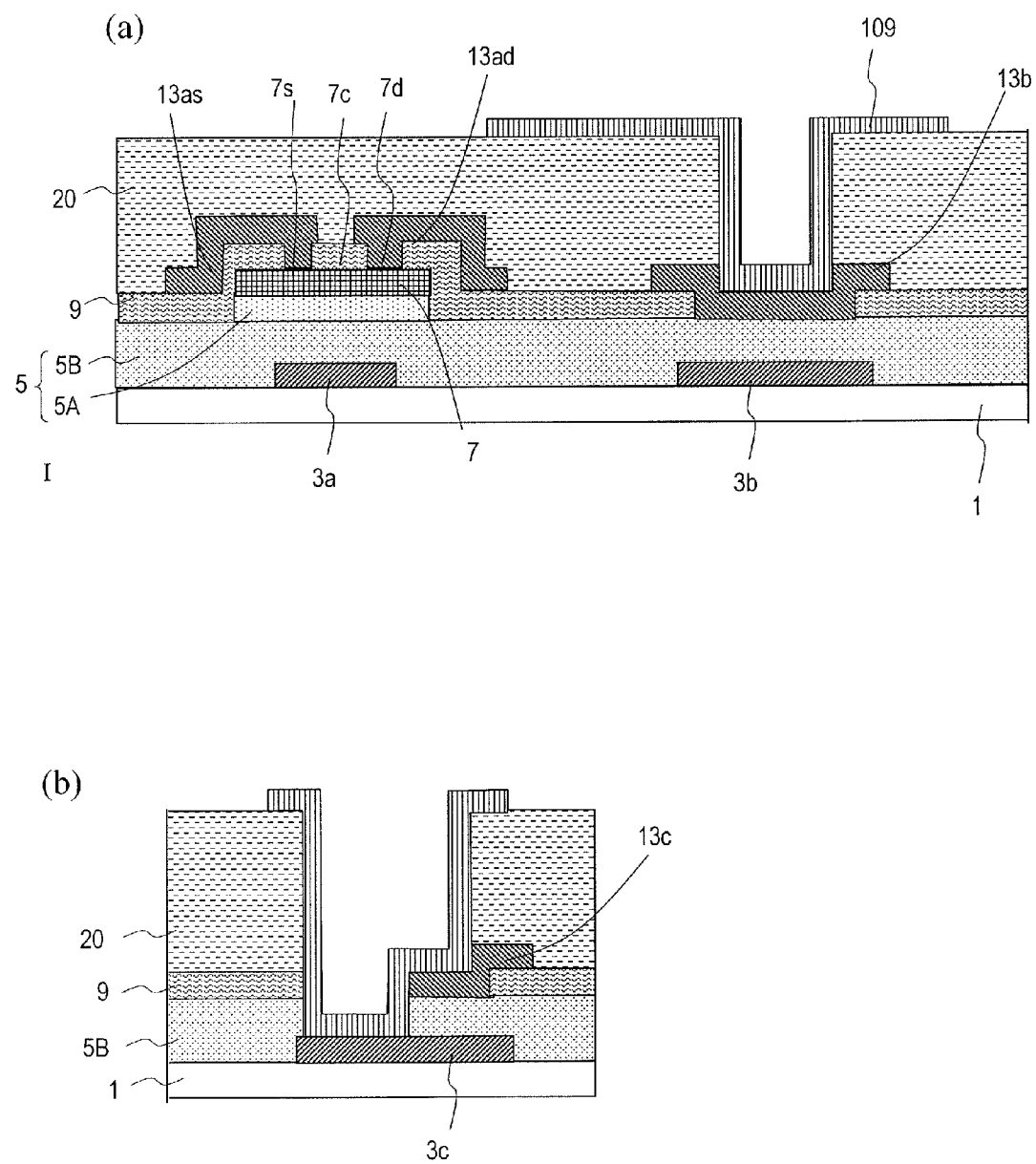
In FIG. 17, (a) and (b) are sectional views of another example of the semiconductor device according to the present invention, respectively.

Also in this embodiment, similarly to the method described above with reference to FIG. 3 to FIG. 5, the patterning of the SiO$_2$ film 5A may be performed simultaneously in the patterning process of the oxide semiconductor layer 7. The other processes are the same as those in the above-described method. In this case, as shown in FIG. 17(*a*) and FIG. 17(*b*), it is possible to obtain a semiconductor device in which an etch stop 9 is formed, and in which an SiO$_2$ film 5A is disposed only under the oxide semiconductor layer 7.

Third Embodiment

Hereinafter a third embodiment of the semiconductor device according to the present invention will be described. The semiconductor device in this embodiment is different from the semiconductor device 1000 described above with reference to FIG. 1 and FIG. 2 in that the gate connecting line 3*c* is directly in contact with the source connecting line 13*c* in the source and gate connecting portion in this embodiment.

FIG. 10(*a*) is a sectional view of an oxide semiconductor TFT 303 and a CS capacitor 305 in the semiconductor device 3000 in this embodiment. FIG. 10(*b*) is a sectional view of a source and gate connecting potion 307. For simplicity, the components which are the same as those in FIG. 1 and FIG. 2 are designated by the same reference numerals, and the descriptions thereof are omitted.

The oxide semiconductor TFT 303 and the CS capacitor 305 in this embodiment have the same configurations as those of the oxide semiconductor TFT 103 and the CS capacitor 105 in the semiconductor device 1000 shown in FIG. 1 and FIG. 2.

On the other hand, as for the source and gate connecting portion 307, as shown in FIG. 10(*b*), the gate connecting line 3*c* and the source connecting line 13*c* are connected in a contact hole 61 formed in the SiNx film 5B. The upper surface of the source connecting line 13*c* is covered with an interlayer insulating layer 20.

Also in this embodiment, similarly to the above-described embodiment, in the oxide semiconductor TFT 303, the deterioration of the oxide semiconductor layer 7 can be suppressed while the electric capacitance of the gate insulating layer 5 is ensured. In the CS capacitor 305, since only the SiNx film 5B is used as the dielectric layer, a sufficient capacitance value can be ensured. In the source and gate connecting portion 307, the source connecting line 13*c* and the gate connecting line 3*c* are directly in contact with each other. With such a configuration, as compared with the case where they are connected via a transparent conductive film or the like, the contact resistance can be further reduced.

Next, an example of the production method of the semiconductor device 3000 in this embodiment will be described.

Figure 11:
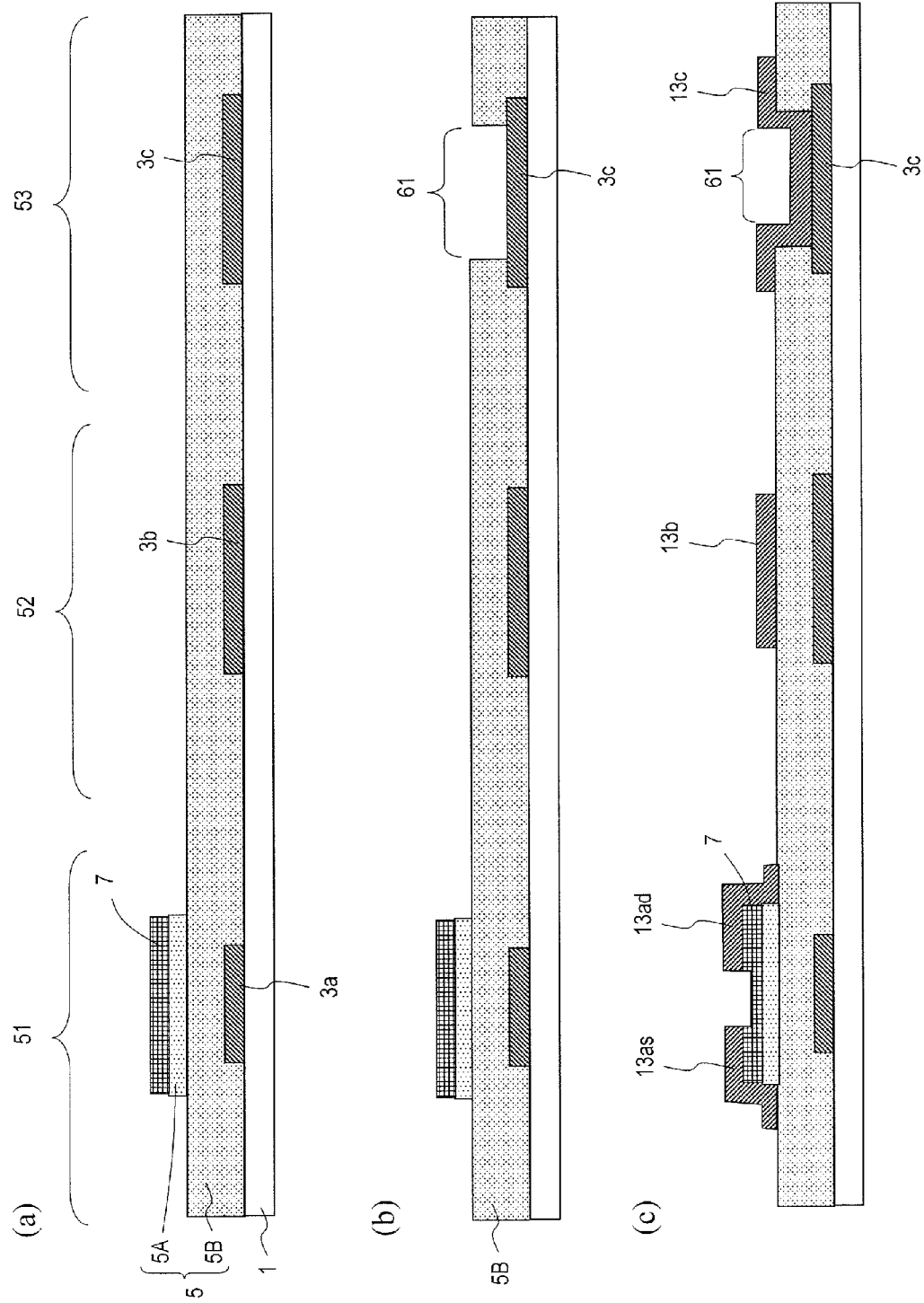
In FIG. 11, (a) to (c) are sectional views of process steps, respectively, for illustrating an example of a production method of the semiconductor device in the third embodiment.
Figure 12:
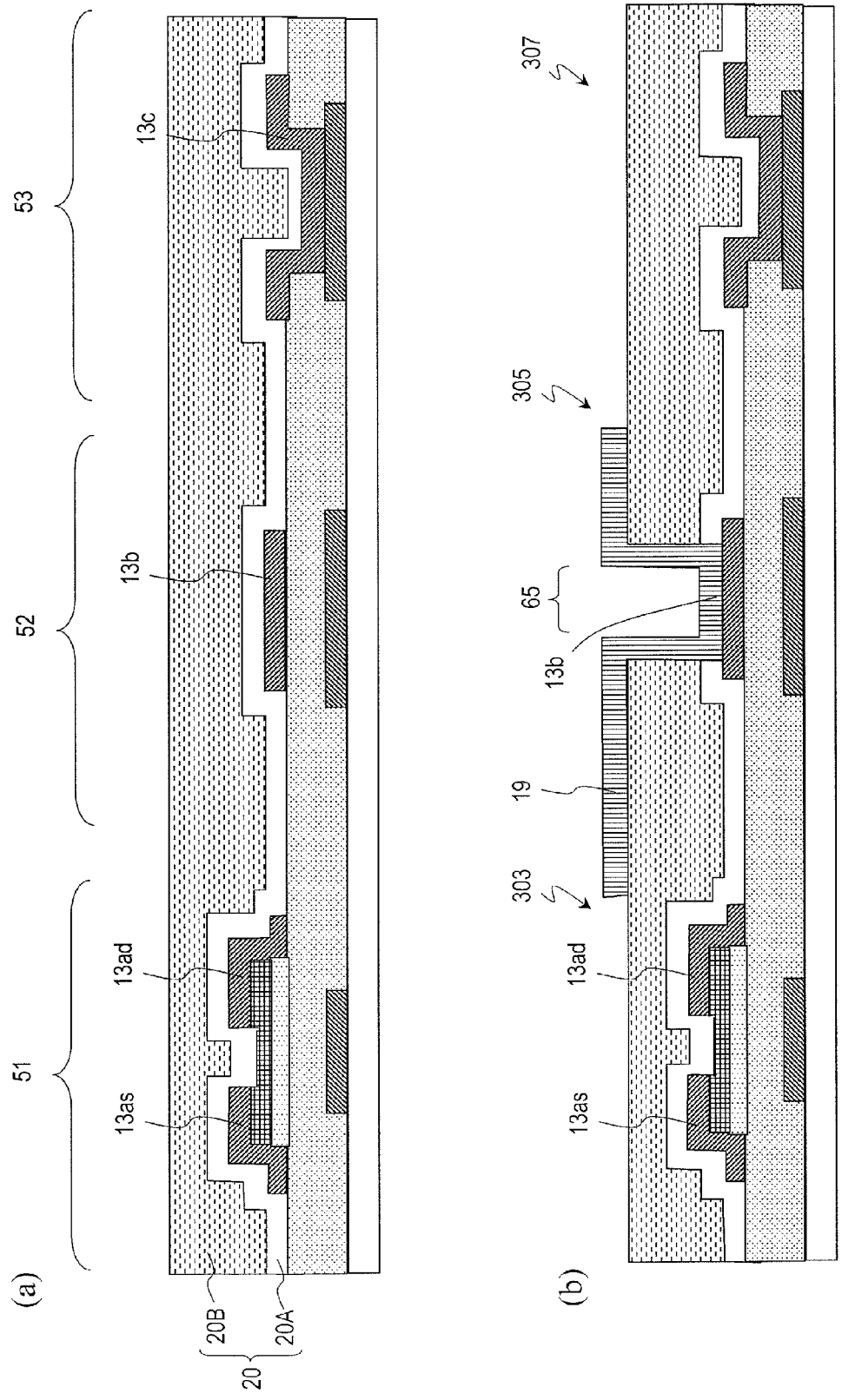
In FIG. 12, (a) and (b) are sectional views of process steps, respectively, for illustrating an example of a production method of the semiconductor device in the third embodiment.

First, FIG. 11(*a*) to FIG. 11(*c*), FIG. 12(*a*), and FIG. 12(*b*) are sectional views of process steps for illustrating the method for forming the oxide semiconductor TFT 303, the CS capacitor 305, and the source and gate connecting portion 307 on the substrate 1, respectively. For simplicity, the components which are the same as those in FIG. 3 to FIG. 5 are designated by the same reference numerals, and the descriptions thereof are omitted.

First, as shown in FIG. 11(*a*), in the substrate 1 such as a glass substrate, a gate line 3*a*, a CS capacitor line 3*b*, and a gate connecting line 3*c* are formed in the TFT forming region 51, the CS capacitor forming region 52, and the connecting portion forming region 53, respectively. Then, so as to cover the gate line 3*a*, the CS capacitor line 3*b*, and the gate connecting line 3*c*, an SiNx film 5B and an SiO$_2$ film 5A are formed in this order. Next, an oxide semiconductor film is formed on the SiO$_2$ film 5A, and an island-like oxide semiconductor layer 7 is obtained by etching. When the etching of the oxide semiconductor film is performed, the etching of the SiO$_2$ film 5A is simultaneously performed. The method for forming these lines, the insulating film, and the oxide semiconductor layer is the same as that described above with reference to FIG. 3(*a*) to FIG. 3(*c*).

Next, as shown in FIG. 11(*b*), in the connecting portion forming region 53, a contact hole 61 for exposing the gate connecting line 3*c* is formed in the SiNx film 5B. The contact hole 61 is formed by known photolithography.

Thereafter, on the oxide semiconductor layer 7 and the SiNx film 5B, and in the contact hole 61, a metal film is deposited by sputtering, for example. Thereafter, the patterning of the metal film is performed, thereby forming source and drain lines 13*as* and 13*ad* in the TFT forming region 51, an upper electrode 13*b* in the CS capacitor forming region 52, and a source connecting line 13*c* in the connecting portion forming region 53, as shown in FIG. 11(*c*). The source connecting line 13*c* is in contact with the gate connecting line 3*c* in the contact hole 61.

Then, as shown in FIG. 12(*a*), on the source and drain lines 13*as* and 13*ad*, the upper electrode 13*b*, and the source connecting line 13*c*, an interlayer insulating layer 20 is provided. Herein, as the interlayer insulating layer 20, by the same method as that in the above-described embodiment, a first interlayer insulating layer 20A (an SiO$_2$ film, for example) and a second interlayer insulating layer 20B (a positive type photosensitive resin film, for example) are formed in this order. As the first interlayer insulating layer 20A, a layered film (see FIG. 2) having an SiO$_2$ film as a lower film, and an SiNx film as an upper film may be formed.

Thereafter, as shown in FIG. 12(*b*), a contact hole 65 is formed in the interlayer insulating layer 20, and a pixel electrode 19 is provided on the interlayer insulating layer 20 and in the contact hole 65.

Specifically, the patterning of the second interlayer insulating layer 20B which is the photosensitive resin film is performed. Then, by using the patterned second interlayer insulating layer 20B as a mask, the etching of the first interlayer insulating layer 20A and the SiNx film 5B is performed. Accordingly, in the CS capacitor forming region 52, the first interlayer insulating layer 20A is etched, thereby forming the contact hole 65 for exposing the upper electrode 13*b*. Next, a conductive film is deposited by sputtering, for example, on the interlayer insulating layer 20 and in the contact hole 65. The patterning of the conductive film is performed, thereby obtaining the pixel electrode 19. Also in this embodiment, the pixel electrode 19 is electrically connected to the drain line 13*ad*, and is in contact with the upper electrode 13*b* in the contact hole 65.

In this way, the oxide semiconductor TFT 303 is formed in the TFT forming region 51, the CS capacitor 305 is formed in the CS capacitor forming region 52, and the source and gate connecting portion 307 is formed in the connecting portion forming region 53.

In this embodiment, an etch stop is not formed. As described above with reference to FIG. 6, an etch stop 9 may be disposed on the oxide semiconductor layer 7. In such a case, in the method described above with reference to FIG. 7 to FIG. 9, after the patterning of the etch stop 9 and the SiO₂ film 5A is performed (FIG. 7(c)), a contact hole 61 for exposing the gate connecting line 3c is formed in the SiNx film 5B in the connecting portion forming region 53. By utilizing the contact hole 61, it is possible to form a source connecting line 13c in a subsequent process step so as to be directly in contact with the gate connecting line 3c.

The semiconductor device 3000 in this embodiment may include a source terminal portion for connecting the source line 13as to an external line, and a gate terminal portion for connecting the gate line 3a to an external line, on the substrate 1.

Table 1 shows the flows of the production processes described in the first to third embodiments. In Table 1, in order to clarify the number of photo processes, serial numbers are assigned to respective photo processes. For example, according to the method in Embodiment 1, five photo processes (five photo masks are used) and six etching processes are performed. Accordingly, as compared with the conventional processes with five masks, the deterioration of the oxide semiconductor layer can be suppressed and the capacitance value of the CS capacitor can be ensured without increasing the number of masks (the number of photo processes).

TABLE 1

|  | Embodiment 1 | Embodiment 2 | Embodiment 3 |
|---|---|---|---|
| Forming Gate | Sputtering (Gate) Photo 1 (Gate) Etching Peeling-off the resist | Sputtering (Gate) Photo 1 (Gate) Etching Peeling-off the resist | Sputtering (Gate) Photo 1 (Gate) Etching Peeling-off the resist |
| Forming Semiconductor layer | CVD (Gate insulating layer) Sputtering (Semiconductor layer) Photo 2 (Semiconductor layer) Etching (Semiconductor layer, First insulating film) Peeling-off the resist | CVD (Gate insulating layer) Sputtering (Semiconductor layer) Photo 2 (Semiconductor layer) Etching (Semiconductor layer) Peeling-off the resist | CVD (Gate insulating layer) Sputtering (Semiconductor layer) Photo 2 (Semiconductor layer) Etching (Semiconductor layer, First insulating film) Peeling-off the resist |
| Forming Gate insulating film |  |  | Photo 3 (Second insulating film) Etching (Second insulating film) Peeling-off the resist |
| Forming Etch stop |  | CVD (Etch stop) Photo 3 (Etch stop) Etching (Etch stop, First insulating film) Peeling-off the resist |  |
| Forming Source | Sputtering (Source) Photo 3 (Source) Etching (Source and channel) Peeling-off the resist | Sputtering (Source) Photo 4 (Source) Etching Peeling-off the resist | Sputtering (Source) Photo 4 (Source) Etching (Source and channel) Peeling-off the resist |
| Forming Insulating film | CVD (First interlayer insulating layer) Photo 4 (Second interlayer insulating layer) Etching (First interlayer insulating layer, Second insulting film) | CVD (First interlayer insulating layer) Photo 5 (Second interlayer insulating layer) Etching (First interlayer insulating layer, Second insulting film) | CVD (First interlayer insulating layer) Photo 5 (Second interlayer insulating layer) Etching (First interlayer insulating layer, Second insulting film) |
| Forming Pixel electrode | Sputtering (Pixel electrode) Photo 5 (Pixel electrode) Etching (Pixel electrode) Peeling-off the resist | Sputtering (Pixel electrode) Photo 6 (Pixel electrode) Etching (Pixel electrode) Peeling-off the resist | Sputtering (Pixel electrode) Photo 6 (Pixel electrode) Etching (Pixel electrode) Peeling-off the resist |

The present invention can be applied to various semiconductor devices provided with oxide semiconductor TFTs and CS capacitors. The configuration of the oxide semiconductor TFT is not limited to those described above in the first to third embodiments.

Figure 13:
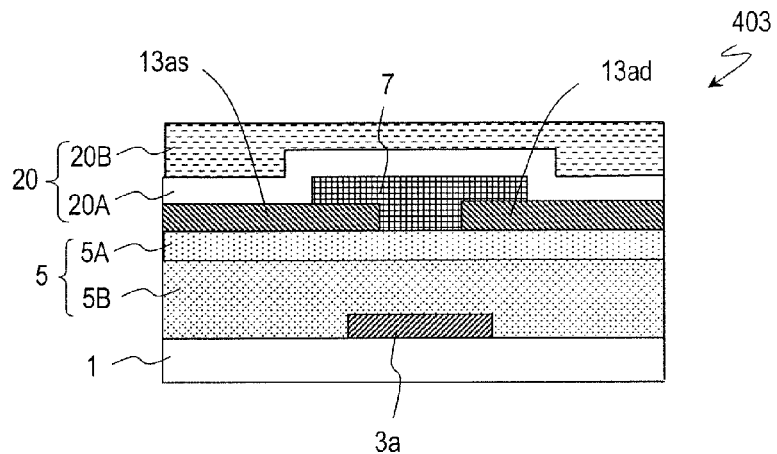
FIG. 13 is a sectional view showing another example of the oxide semiconductor TFT.
Figure 14:
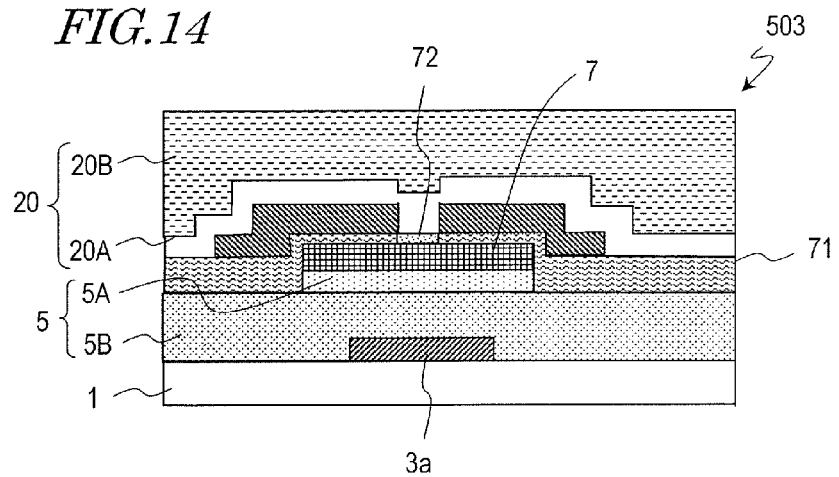
FIG. 14 is a sectional view showing another example of the oxide semiconductor TFT.
Figure 15:
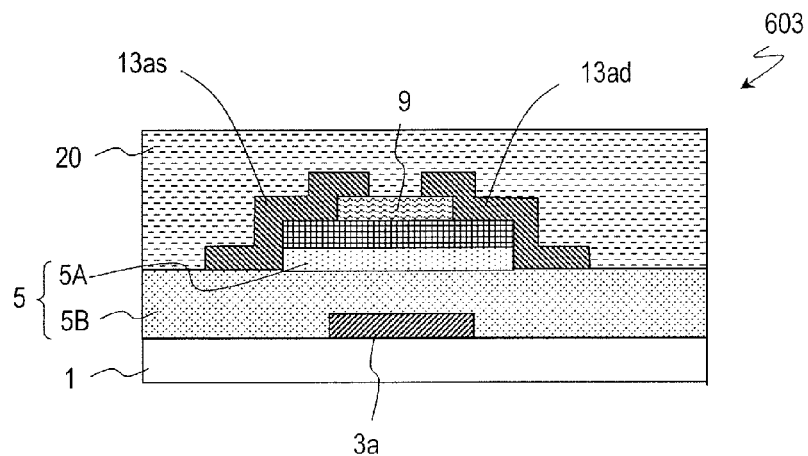
FIG. 15 is a sectional view showing another example of the oxide semiconductor TFT.

FIG. 13 to FIG. 15 are sectional views showing other examples of the oxide semiconductor TFT.

In an oxide semiconductor TFT 403 shown in FIG. 13, an oxide semiconductor layer 7 is formed on source and drain lines 13as and 13ad.

As in an oxide semiconductor TFT 503 shown in FIG. 14, a Ti film may be used as the etch stop. In the oxide semiconductor TFT 503, after an oxide semiconductor layer 7 is covered with a Ti film 71, source and drain lines 13as and 13ad are formed on the Ti film 71. Then, only a portion of the Ti film 71 which is positioned on the channel region is oxidized, thereby forming an insulator (TiOx) 72 for insulating the source from the drain.

In addition, as in an oxide semiconductor TFT 603 shown in FIG. 15, an etch stop 9 may be disposed only on a region of an oxide semiconductor layer 7 which includes the channel region.

In all of the examples shown in FIG. 13 to FIG. 15, a gate insulating layer 5 has an SiNx film 5B and an SiO₂ film 5A formed thereon, and only the SiO₂ film 5A is in contact with the oxide semiconductor layer 7, similarly to the above-described embodiments. Although not shown in the figures, an interlayer insulating layer 20 may include a first interlayer insulating layer including a silicon oxide film and a second interlayer insulating layer formed thereon, similarly to the above-described embodiments. In the case where the first interlayer insulating layer 20A is in contact with the oxide semiconductor layer 7, at least a portion which is in contact with the oxide semiconductor layer 7 is preferably configured by a silicon oxide film. Accordingly, it is possible to suppress the occurrence of deterioration of the oxide semiconductor layer 7 due to oxygen deficiency.

In the examples shown in FIG. 14 and FIG. 15, when the oxide semiconductor layer 7 is etched, the SiO₂ film 5A is also etched. When viewed from the above of the substrate 1, the oxide semiconductor layer 7 and the SiO₂ film 5A have substantially the same pattern. However, the configuration of this embodiment is not limited to this exemplary configuration. It is sufficient that the etching of the SiO₂ film 5A may be performed before the deposition of a metal film which will be the source and drain lines and the upper electrode of the CS capacitor. The etching of the SiO$_2$ film 5A is not necessarily performed when the etching of the oxide semiconductor layer 7 is performed. In such a case, the patterns of the oxide semiconductor layer 7 and the SiO$_2$ film 5A when viewed from the above of the substrate 1 are different from each other.

Although not shown in the figures, on the same substrate on which the oxide semiconductor TFT 403, 503, 603 is formed, the CS capacitor and the source and gate connecting portion are formed. The CS capacitor utilizes only the SiNx film 5B of the gate insulating layer 5 as the dielectric layer. The configurations of the CS capacitor and the source and gate connecting portion may be the same as those described above with reference to FIG. 2.

The oxide semiconductor TFT of the present invention may have a top-gate structure.

Figure 16:
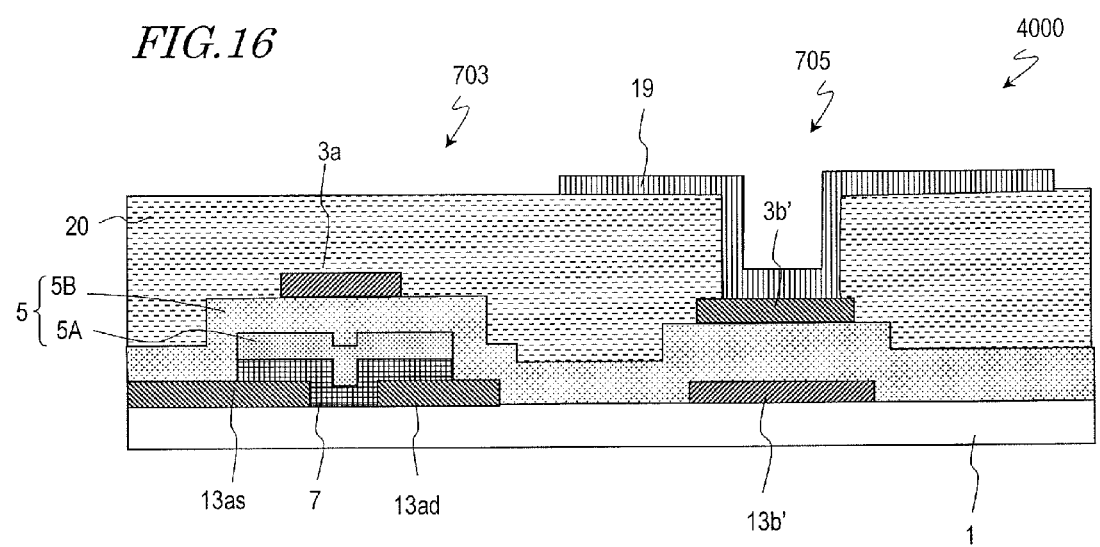
FIG. 16 is a sectional view showing an example of a semiconductor device including an oxide semiconductor TFT having a top-gate structure according to the present invention.

FIG. 16 is a sectional view of a semiconductor device 4000 including an oxide semiconductor TFT having the top-gate structure. For simplicity, the components which are the same as those in FIG. 1 to FIG. 15 are designated by the same reference numerals, and the descriptions thereof are omitted.

The semiconductor device 4000 includes an oxide semiconductor TFT 703 and a CS capacitor 705.

The oxide semiconductor TFT 703 includes source and drain lines 13as and 13ad formed on a substrate 1, an oxide semiconductor layer 7 disposed so as to be in contact with these lines 13as and 13ad, a gate line 3a, a gate insulating layer 5 formed between the gate line 3a and the oxide semiconductor layer 7, and an interlayer insulating layer 20 which covers the gate line 3a. The gate insulating layer 5 has a layered structure (a two-layer structure) including an SiO$_2$ film 5A which is in contact with the oxide semiconductor layer 7, and an SiNx film 5B formed on the SiO$_2$ film 5A. In this example, the SiO$_2$ film 5A is patterned simultaneously with the oxide semiconductor layer 7. Since the interlayer insulating layer 20 is not in contact with the oxide semiconductor layer 7, it does not necessarily include the SiO$_2$ film. For example, the interlayer insulating layer 20 may include a first interlayer insulating layer of an SiNx film and a second interlayer insulating layer of a resin film formed thereon.

The CS capacitor 705 is provided with a CS capacitor line 13b' formed from the same film as that of the source and drain lines 13as and 13ad, an upper electrode 3b' formed from the same film as that of the gate line 3a, and a dielectric layer 5 positioned therebetween. Similarly to the above-described embodiments, only the SiNx film 5B of the gate insulating layer 5 constitutes the dielectric layer.

As described above, in the oxide semiconductor TFT 703 having the top-gate structure, the gate insulating layer 5 having the layered structure is formed, the SiO$_2$ film 5A is disposed on the side closest to the oxide semiconductor layer 7 (the undermost layer) of the gate insulating layer 5, and a film having high dielectric constant such as an SiNx film is formed on the SiO$_2$ film 5A. In addition, as the dielectric layer of the CS capacitor 705, the SiNx film as an upper layer of the gate insulating layer 5 is utilized. With such a configuration, similarly to the above-described embodiments, the deterioration of the oxide semiconductor layer 7 can be suppressed while the electric capacitance of the gate insulating layer 5 and the capacitance value of the CS capacitor are sufficiently ensured.

INDUSTRIAL APPLICABILITY

The present invention can be widely applied to devices provided with thin film transistors. Such devices include a circuit substrate such as an active matrix substrate, a liquid crystal display device, a display device such as an organic electroluminescence (EL) display device and an inorganic electroluminescence display device, an image pickup device such as an image sensor device, and an electronic device such as an image input device or a finger print reading device. Especially, the present invention can be suitably applied to a liquid crystal display device with large screen, and the like.

| REFERENCE SIGNS LIST | |
|---|---|
| 1 | Substrate |
| 3a | Gate line |
| 3b | CS capacitor line |
| 3c | Gate connecting line |
| 5 | Gate insulating layer |
| 5A | SiO$_2$ film (First insulating film) |
| 5B | SiNx film (Second insulating film) |
| 7 | Oxide semiconductor layer (Active layer) |
| 7s | First contact region |
| 7d | Second contact region |
| 7c | Channel region |
| 9 | Etch stop |
| 13as | Source line |
| 13ad | Drain line |
| 13b | Upper electrode |
| 13c | Source connecting line |
| 19 | Pixel electrode |
| 19c | Conductive layer |
| 20 | Interlayer insulating layer |
| 20A | First interlayer insulating layer (Passivation film) |
| 20A(1) | SiO$_2$ film (Lower film) |
| 20A(2) | SiNx film (Upper film) |
| 20B | Second interlayer insulating layer |
| 103, 203, 303, 403, 503, 603, 703 | Oxide semiconductor TFT |
| 105, 205, 305, 705 | CS capacitor (Capacitor element) |
| 107, 207, 307 | Source and gate connecting portion |
| 1000, 2000, 3000, 4000 | Semiconductor device |

The invention claimed is:

1. A semiconductor device comprising a substrate, and a thin film transistor and a capacitor element disposed on the substrate, wherein the thin film transistor includes:

an island-like oxide semiconductor layer having a channel region, and a first contact region and a second contact region positioned on respective sides of the channel region;

a gate line disposed on a side of the substrate of the oxide semiconductor layer so as to overlap at least the channel region of the oxide semiconductor layer;

a gate insulating layer formed between the gate line and the oxide semiconductor layer;

a source line electrically connected to the first contact region;

a drain line electrically connected to the second contact region; and an etch stop covering at least the channel region of the oxide semiconductor layer, the capacitor element includes:

a first electrode formed from the same conductive film as the gate line;

a second electrode formed from the same conductive film as the source line; and a dielectric layer positioned between the first and second electrodes, the gate insulating layer has a layered structure including a first insulating film containing an oxide which is in contact with the oxide semiconductor layer, and a second insulating film disposed on the side closer to the gate line than the first insulating film, the second insulating film having a dielectric constant higher than the first insulating film, the dielectric layer includes the second insulating film, but does not include the first insulating film, and in a region where the capacitor element is formed, an opening portion which reaches the second insulating film is formed in the etch stop and the first insulating film, and the second electrode is in contact with the second insulating film in the opening portion.

2. The semiconductor device of claim 1, further comprising a first interlayer insulating layer disposed on the thin film transistor and the capacitor element, and a second interlayer insulating layer disposed on the first interlayer insulating layer, wherein the first interlayer insulating layer has a layered structure including a lower film containing an oxide and an upper film disposed on the lower film.

3. The semiconductor device of claim 2, further comprising a conductive layer disposed on the second interlayer insulating layer, wherein the conductive layer is electrically connected to the first electrode or the second electrode of the capacitor element.

4. The semiconductor device of claim 1, wherein the thickness of the second insulating film is larger than the thickness of the first insulating film, and equal to or smaller than five times the thickness of the first insulating film.

5. The semiconductor device of claim 1, wherein the first insulating film is a silicon oxide film, and the second insulating film is a silicon nitride film.

6. A production method of the semiconductor device of claim 1, comprising the steps of:
 (A) forming a gate line and a first electrode of a capacitor element on a substrate;
 (B) depositing a second insulating film, a first insulating film, and an oxide semiconductor film, in this order, on the substrate on which the gate line and the first electrode are formed;
 (C) patterning the oxide semiconductor film, thereby obtaining an island-like oxide semiconductor layer;
 (F) forming an etch stop on the oxide semiconductor layer and the first insulating film;
 (D) removing a portion of the first insulating film and the etch stop positioned on the first electrode, thereby exposing the surface of the second insulating film; and
 (E) forming a metal film on the oxide semiconductor layer and on the exposed surface of the second insulating film, and patterning the metal film, thereby obtaining a source line, a drain line, and a second electrode of the capacitor element.

7. The production method of the semiconductor device of claim 6,
 the step (D) includes a step of patterning the first insulating film simultaneously with patterning the etch stop, and
 in the steps (D), a portion of the etch stop positioned on a region which will be the first and second contact regions of the oxide semiconductor layer is removed, and a portion of the etch stop and the first insulating film positioned on the first electrode is removed, thereby exposing the second insulating film.

8. The method of the semiconductor device of claim 6, wherein the first insulating film is a silicon oxide film, and the second insulating film is a silicon nitride film.

9. The semiconductor device of claim 1, wherein, when viewed from above the substrate, end faces of the etch stop and the first insulating film substantially match in the opening portions.

10. The semiconductor device of claim 1, wherein the oxide semiconductor layer is an In—Ga—Zn—O semiconductor layer.

11. The production method of the semiconductor device of claim 6, wherein the oxide semiconductor layer is an In—Ga—Zn—O semiconductor layer.

* * * * *